(12) United States Patent
Suzuki et al.

(10) Patent No.: US 7,868,682 B2
(45) Date of Patent: Jan. 11, 2011

(54) INSULATING COMMUNICATION CIRCUIT

(75) Inventors: Kouji Suzuki, Shioya (JP); Kenichi Takebayashi, Shioya (JP); Kazutaka Senoo, Shioya (JP)

(73) Assignee: Keihin Corporation, Tokyo (JP)

( * ) Notice: Subject to any disclaimer, the term of this patent is extended or adjusted under 35 U.S.C. 154(b) by 30 days.

(21) Appl. No.: 12/481,206

(22) Filed: Jun. 9, 2009

(65) Prior Publication Data
US 2009/0309643 A1    Dec. 17, 2009

(30) Foreign Application Priority Data
Jun. 11, 2008    (JP)    ............................. 2008-152667

(51) Int. Cl.
*H03K 5/08*    (2006.01)

(52) U.S. Cl. ...................................... 327/317; 327/551

(58) Field of Classification Search ................. 327/317, 327/362, 378, 379, 551
See application file for complete search history.

(56) References Cited

U.S. PATENT DOCUMENTS

| 6,191,647 | B1 * | 2/2001 | Tanaka et al. ................ 327/551 |
| 6,310,504 | B1 * | 10/2001 | Suh et al. ..................... 327/262 |
| 6,535,057 | B2 * | 3/2003 | Chakravarthy .............. 327/551 |
| 7,397,292 | B1 * | 7/2008 | Potanin ....................... 327/261 |

FOREIGN PATENT DOCUMENTS

JP    2006-033647 A    2/2006

* cited by examiner

*Primary Examiner*—Hai L Nguyen
(74) *Attorney, Agent, or Firm*—Westerman, Hattori, Daniels & Adrian, LLP

(57) ABSTRACT

According to an embodiment of the present invention, an insulating communication circuit includes a first insulating circuit 62#11 having first and second circuits, a second insulating circuit 62#12 having third and fourth circuits, and a communication interface that is connected to a first ground and transmits a signal to the first circuit based on a communication signal and a clock signal from an external control device.

6 Claims, 15 Drawing Sheets

INSULATING COMMUNICATION CIRCUIT

BACKGROUND OF THE INVENTION

1. Field of the Invention

The present invention relates to an insulating communication circuit and transmission of a communication signal by an insulating circuit between a low-voltage system and a high-voltage system having different grounds.

2. Description of the Related Art

In electric vehicles such as electric cars and hybrid cars, a DC voltage from a high-voltage DC power supply is converted to an AC voltage, e.g. a three-phase AC voltage, by an inverter and an electric machine as a load is rotated by this three-phase AC voltage to thereby obtain the drive source of vehicle travelling. Furthermore, a hybrid vehicle is a car that employs a motor in addition to an engine as the drive source of its travelling, and the motor is driven to assist the engine and carry out regenerative braking of the motor.

The inverter has switch elements and free-wheel diodes connected in anti-parallel to the switch elements on the high side and the low side for the U-, V-, and W-phases. The inverter carries out switching of the switch elements based on a PWM system to thereby obtain the three-phase AC voltage.

Due to the switching-ON/OFF of the switch elements, the phase voltage changes, and a common mode current flows to the vehicle body (body ground (hereinafter, the low-voltage system ground)) via the parasitic capacitance between the positive line of the high-voltage DC power supply and the low-voltage system ground, the parasitic capacitance between the ground connected to the negative electrode of the high-voltage DC power supply (hereinafter, the high-voltage system ground) and the low-voltage system ground, a Y-capacitor provided between the positive line of the high-voltage DC power supply and a low-voltage system ground line and the low-voltage system ground, the parasitic capacitance between motor coils and the low-voltage system ground, and the parasitic capacitance between three-phase power supply lines interconnecting the inverter and the motor coils and the low-voltage system ground.

Furthermore, due to the switching-ON/OFF of the switch elements, the connecting parts between the switch elements on the low side and the high-voltage system ground line connected to the negative electrode of the high-voltage DC power supply are in such a state that the potential of the high-voltage system ground easily changes due to a current flow attributed to commutation at the time of the switching or the like. This potential change of the high-voltage system ground is transmitted to other high-voltage system grounds that share the ground, so that the potential of the high-voltage system ground changes.

On the other hand, electrical loads such as an ECU typified by an engine ECU, a headlight, car audio equipment, and a door mirror heater operate based on power from a 12-V battery whose negative electrode is connected to the vehicle body. The components whose ground is the vehicle body are referred to as the low-voltage system. In electric vehicles, the high-voltage system whose ground is the high-voltage system ground and the low-voltage system exist in a mixed manner.

In order to drive the motor with the optimum torque based on the engine torque and so on, a communication signal of the target torque and so on and a gate signal need to be transmitted from the low-voltage system to the high-voltage system. For this signal transmission from the low-voltage system to the high-voltage system, a pulse transformer is used because a photocoupler or the like is expensive.

The primary winding and the secondary winding of the pulse transformer are insulated from each other by covering of the windings or an inter-phase tape, and the primary winding and the secondary winding have coupling capacitance because they are very close to each other. If the potential of the high-voltage system ground of the secondary winding of the pulse transformer changes, the voltage between the primary winding and the secondary winding changes.

The time period of this voltage change is on the order of microseconds or shorter. Even with low coupling capacitance, this voltage change causes a common mode current to flow from the secondary winding to the primary winding or from the primary winding to the secondary winding via the coupling capacitance between the primary winding and the secondary winding. The flow of the common mode current generates voltage across the primary winding and the secondary winding due to the coil inductance and the coil resistance of the primary winding and the secondary winding. As a result, the voltage across the secondary winding changes, so that noise due to the common mode current is added to the communication signal that should be transmitted.

In a related art, for the pulse transformer that transmits a signal from the low-voltage system to the high-voltage system, the noise added to the communication signal due to the common mode current is removed by a filter. Examples of the related art relating to the common mode current include Japanese Patent Laid-Open No. 2006-33647. In the technique disclosed in Japanese Patent Laid-Open No. 2006-33647, the common mode current is detected by the common mode noise detection circuit 8 and the common mode noise cancel circuit 9 is driven by the detected electric signal to thereby cancel the common mode current.

However, the related art involves a problem that the communication signal is delayed because the common mode current flows via the coupling capacitance of the pulse transformer and the noise added to the communication signal is removed by using the filter. Furthermore, as another problem, the noise can not be sufficiently removed when the level of the noise is high. In addition, the above-described patent document involves a problem that the cost is high because the noise cancel circuit for cancelling noise is necessary.

The present invention is made in view of the above-described problems and an object thereof is to provide an insulating communication circuit that has solutions to the problems such as signal delay and insufficient noise removal and allows cost reduction without using the noise cancel circuit and the filter.

SUMMARY OF THE INVENTION

An object of the present invention is made in view of the above description and is to provide an insulating communication circuit that has solutions to problems such as signal delay and insufficient noise removal and allows cost reduction without using a noise cancel circuit and a filter.

According to a first aspect of the present invention, there is provided an insulating communication circuit that transmits a communication signal based on insulation from first ground circuitry having a first ground to second ground circuitry having a second ground different from the first ground. The insulating communication circuit includes a first insulating circuit that has first and second circuits, a second insulating circuit that has third and fourth circuits, and a communication interface that is connected to the first ground and transmits a signal to the first circuit based on a communication signal and a clock signal from an external control device. Furthermore, the insulating communication circuit also includes a secondary-side signal detection circuit that is connected to the second ground and detects a communication signal from the output of the second circuit based on the output of the first circuit, a primary-side noise detection circuit that is connected to the first ground and detects a common mode current between the third and fourth circuits, and a secondary-side noise detection circuit that is connected to the second ground and detects common mode noise from the output of the fourth circuit based on the common mode current to output a noise detection signal. In addition, the insulating communication circuit further includes a delay time adjustment circuit that adjusts the transmission speed of a communication signal detected by the secondary-side signal detection circuit and the transmission speed of the noise detection signal detected by the secondary-side noise detection circuit, and a signal latch circuit that latches a communication signal adjusted by the delay time adjustment circuit when the noise detection signal adjusted by the delay time adjustment circuit detects the common mode noise.

According to a second aspect of the present invention, in the first aspect of the present invention, a first pulse transformer including a first primary winding and a first secondary winding and a second pulse transformer including a second primary winding and a second secondary winding are used.

According to a third aspect of the present invention, in the second aspect of the present invention, the first and second pulse transformers are housed in an IC package. Furthermore, the first and second primary windings are mounted on a first conductor and the first and second secondary windings are mounted on a second conductor. A first ground for a signal transmitted to the first primary winding is supplied from the first conductor and a first ground of the primary-side noise detection circuit is connected to the first conductor. In addition, the second ground of the secondary-side signal detection circuit and the secondary-side noise detection circuit is connected to the second conductor.

According to a fourth aspect of the present invention, in the third aspect of the present invention, the first ground is a low-voltage system ground connected to a vehicle body, and the second ground is a high-voltage system ground connected to the negative electrode of a high-voltage DC power supply.

According to a fifth aspect of the present invention, in the fourth aspect of the present invention, the delay time adjustment circuit carries out adjustment in such a way that the transmission speed of the noise detection signal is set higher than the transmission speed of the communication signal at the start of the common mode noise and the transmission speed of the noise detection signal is set lower than the transmission speed of the communication signal at the end of the common mode noise.

According to a sixth aspect of the present invention, in the fifth aspect of the present invention, the delay time adjustment circuit includes a plurality of RC circuits for the communication signal and the noise detection signal. Furthermore, the time constant of an RC circuit relating to the communication signal is larger than the time constant of an RC circuit relating to the noise detection signal at the start of the common mode noise, and the time constant of an RC circuit relating to the communication signal is smaller than the time constant of an RC circuit relating to the noise detection signal at the end of the common mode noise.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
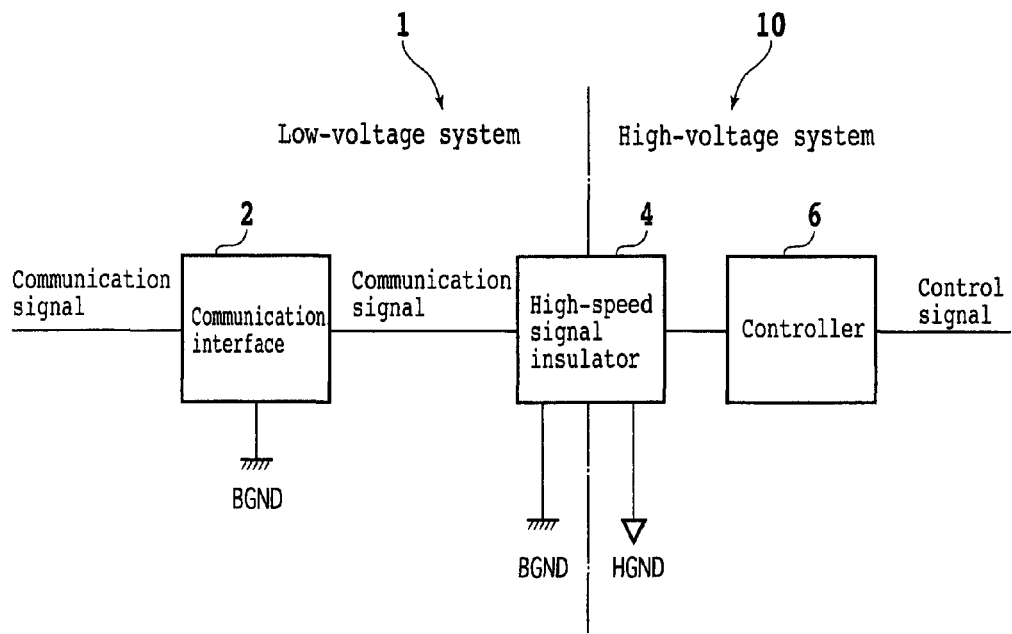
FIG. 1A is a diagram of a configuration to which an insulating communication circuit according to an embodiment of the present invention is applied.
Figure 1B:
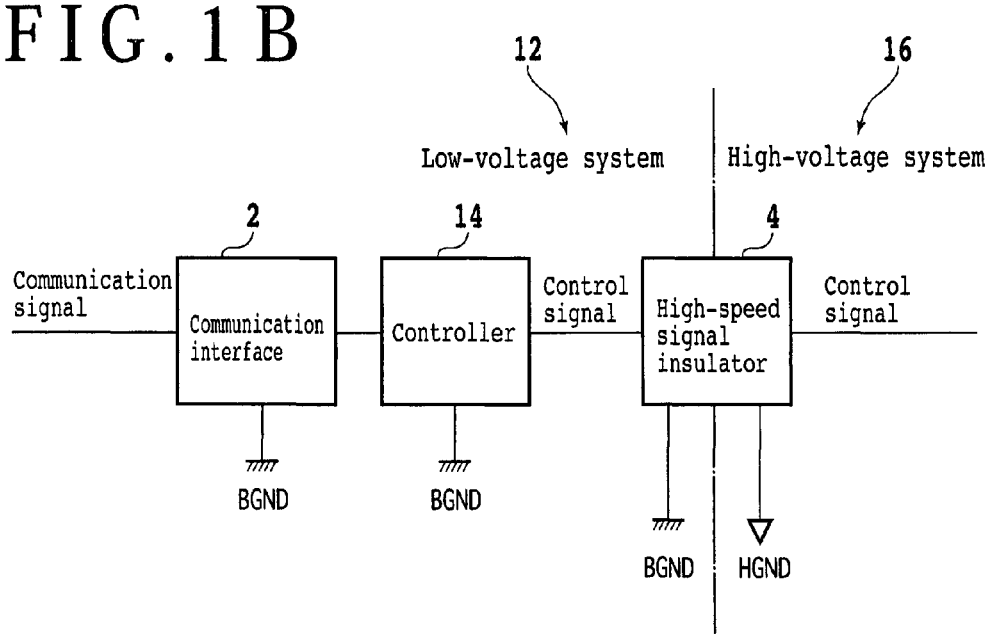
FIG. 1B is a diagram of a configuration to which an insulating communication circuit according to an embodiment of the present invention is applied.

Prior to the description of embodiments of the present invention, the place to which the insulating communication circuit of the embodiment of the present invention is applied will be described below. FIGS. 1A and 1B are diagrams showing the place to which the insulating communication circuit of the embodiment of the present invention is applied. In the form shown in FIG. 1A, a controller 6 relating to PWM control for driving a motor is included in a high-voltage system 10 employing a high-voltage system ground HGND as its ground, and signal communication is carried out with an external control device via a communication interface 2 included in a low-voltage system 1 employing a low-voltage system ground BGND as its ground. In this form, a high-speed signal insulator 4 is provided between the controller 6 and the communication interface 2. The communication interface 2 transmits a signal to the high-speed signal insulator 4 based on e.g. a communication signal and a clock signal from the external control device. The communication signal from the communication interface 2 is transmitted from the low-voltage system 1 to the high-voltage system 10 by the high-speed signal insulator 4 and is output to the controller 6. Furthermore, a communication signal from the controller 6 is transmitted from the high-voltage system 10 to the low-voltage system 1 by the high-speed signal insulator 4 and is output to the external control device via the communication interface 2.

In the form shown in FIG. 1B, a controller 14 relating to PWM control for driving a motor is included in a low-voltage system 12 employing the low-voltage system ground BGND as its ground, and carries out signal communication with an external unit via the communication interface 2 in the low-voltage system 12. Furthermore, the controller 14 generates a gate signal relating to the PWM control based on a communication signal and transmits the gate signal to a high-voltage system 16 employing the high-voltage system ground HGND as its ground, specifically to e.g. a gate driver, via the high-speed signal insulator 4. In this form, the high-speed signal insulator 4 is provided between the controller 14 and the high-voltage system 16 such as the gate driver. The gate signal from the controller 14 is transmitted from the low-voltage system 12 to the high-voltage system 16 by the high-speed signal insulator 4 and is output to the gate driver.

First Embodiment

Figure 2:
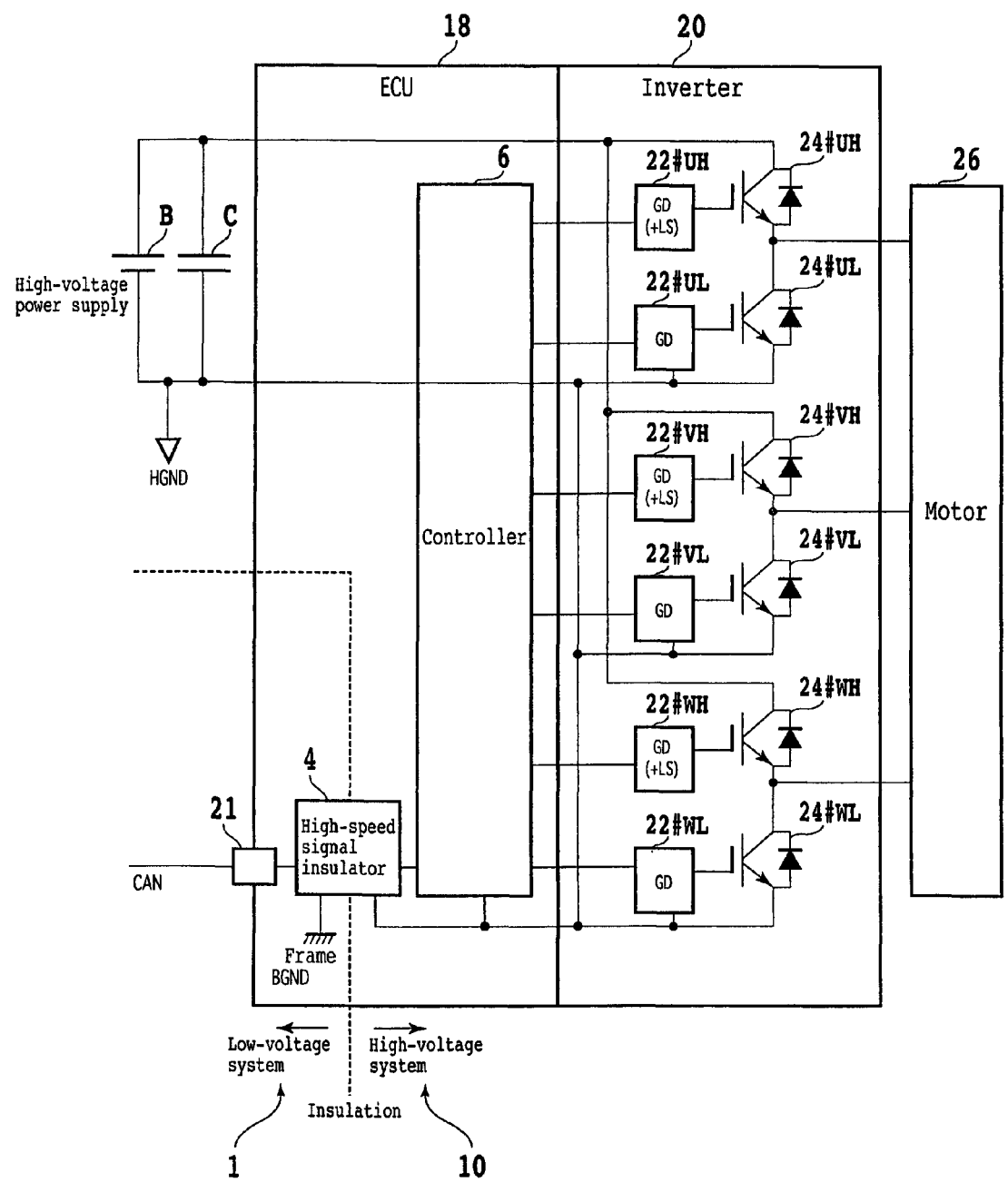
FIG. 2 is a schematic configuration diagram of an electric vehicle according to a first embodiment of the present invention.

FIG. 2 is a schematic configuration diagram of a hybrid vehicle as an electric vehicle showing a first embodiment of the present invention corresponding to FIG. 1A. As shown in FIG. 2, the hybrid vehicle includes a high-voltage power supply B, a smoothing capacitor C, an ECU 18, an inverter 20, and a motor 26.

The high-voltage power supply (high-voltage DC power supply) B is an electric power storage device for supplying power to the motor 26 via the inverter 20 and is a lithium ion battery, a nickel hydrogen battery, or the like. For the high-voltage power supply B, plural battery blocks each obtained by collecting plural cells into a module are connected in series. The smoothing capacitor C is a capacitor for smoothing outputs from the high-voltage power supply B and the inverter 20.

The ECU 18 includes the controller 6, the high-speed signal insulator 4, and a transceiver 21. The controller 6 is included in the high-voltage system 10. The controller 6 carries out PWM modulation based on the communication signal of the target motor torque and so on from an external control device 30 and outputs the gate signals to the inverter 20.

The high-speed signal insulator 4 includes a pulse transformer and a delay time adjustment circuit for each of the communication signal and a noise detection signal, and includes primary-side and secondary-side noise detection circuits for the noise detection signal. In addition, it includes a drive circuit, a secondary-side signal detection circuit, and a signal latch circuit for the communication signal.

The drive circuit serves as a part of the communication interface 2 and drives the primary winding of the pulse transformer for the communication signal based on e.g. the communication signal and the clock signal from the external control device 30. The primary-side and secondary-side noise detection circuits detect common mode noise due to a common mode current. The clock signal may be generated by an oscillator instead of being supplied from the external control device 30.

The delay time adjustment circuit is a circuit that adjusts the transmission speeds of the communication signal detected by the secondary-side signal detection circuit and the noise detection signal detected by the secondary-side noise detection circuit. For example, the delay time adjustment circuit adjusts the transmission speeds in such a way that the transmission speed of the noise detection signal is set higher than that of the communication signal at the start of common mode noise and the transmission speed of the noise detection signal is set lower than that of the communication signal at the end of the common mode noise. The signal latch circuit latches the communication signal whose transmission speed is adjusted by the delay time adjustment circuit while the level of the noise detection signal whose transmission speed is adjusted by the delay time adjustment circuit indicates a noise detection period, to thereby block common mode noise added to the communication signal.

The transceiver 21 is included in the low-voltage system 1 and corresponds to the communication interface 2 in FIG. 1A. The transceiver 21 sends and receives the communication signal to and from the external control device 30. The communication signal is not limited as long as it is a signal communicated based on a predetermined interface.

The inverter 20 is included in the high-voltage system 10. When the motor 26 is driven, the inverter 20 turns ON/OFF switch elements 24#$i$ ($i$=UH, UL, VH, VL, WH, WL) via gate drivers 22#$i$ ($i$=UH, UL, VH, VL, WH, WL) based on the gate signals that are sent from the controller 6 and subjected to the PWM modulation. Thereby, the inverter 20 converts a DC voltage from the high-voltage power supply B to a three-phase AC voltage and outputs it to the motor 26.

The output shaft of the motor (load) 26 is coupled to the crankshaft of an engine (not shown), and e.g. a three-phase brushless motor is used as the motor 26. When being driven, the motor 26 is supplied with AC power, e.g. three-phase AC power, by the inverter 20 and operates as an electric machine. The driving of the electric machine activates the engine and assists the driving force of the engine.

Figure 3:
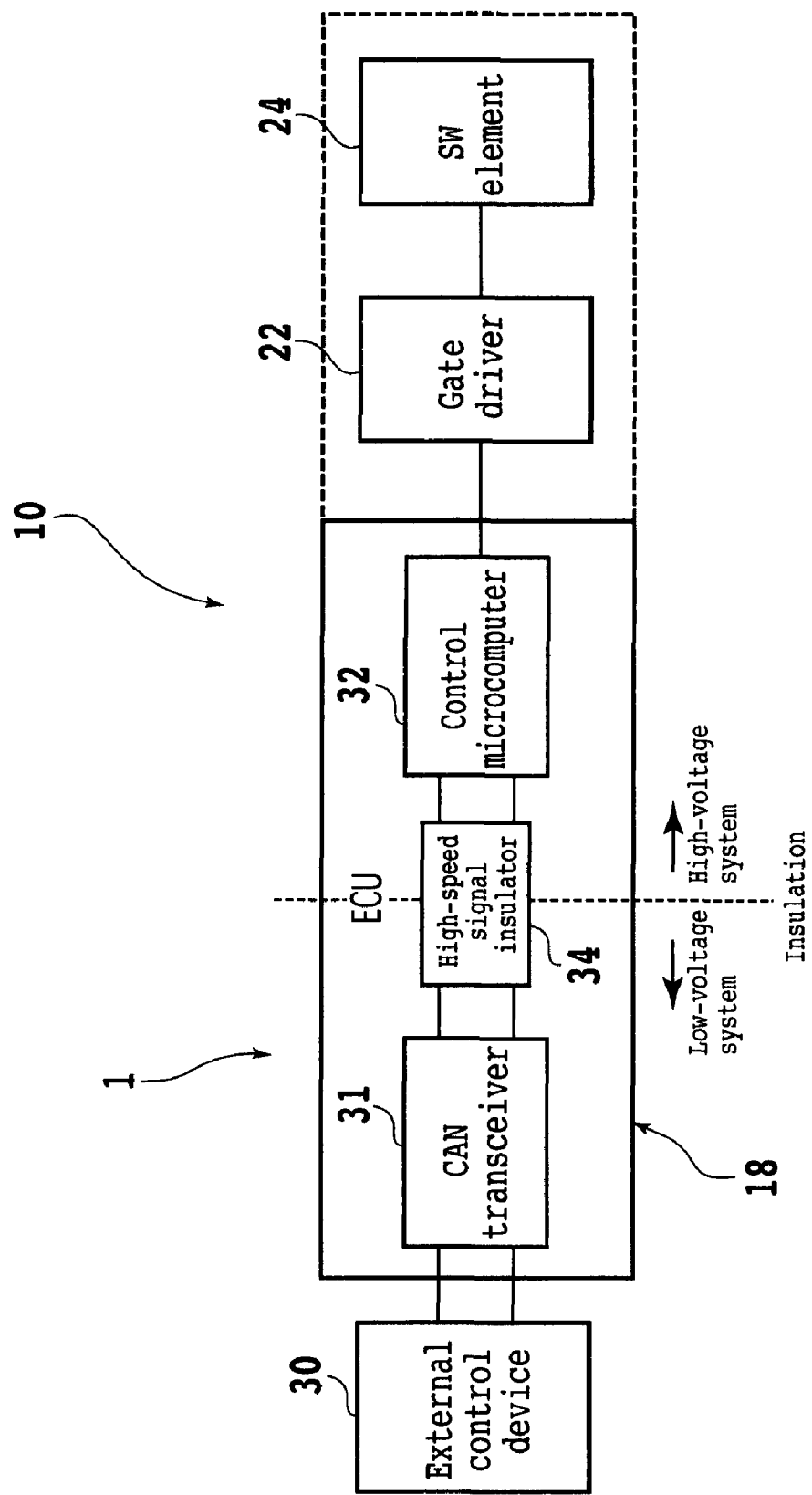
FIG. 3 is a diagram showing an ECU in FIG. 2.

FIG. 3 is a diagram showing a configuration example of the ECU 18 in FIG. 2. As shown in FIG. 3, the ECU 18 has a CAN transceiver 31, a control microcomputer 32, and a high-speed signal insulator 34. The CAN transceiver 31 corresponds to the transceiver 21 and sends and receives a CAN signal between the external control device 30 in the low-voltage system 1 and the control microcomputer 32 based on e.g. a communication interface specified by the CAN.

The control microcomputer 32 operates as the controller 6. The high-speed signal insulator 34 carries out insulated communication of a reception signal Rx and a transmission signal Tx between the CAN transceiver 31 in the low-voltage system 1 and the control microcomputer 32.

Figure 4:
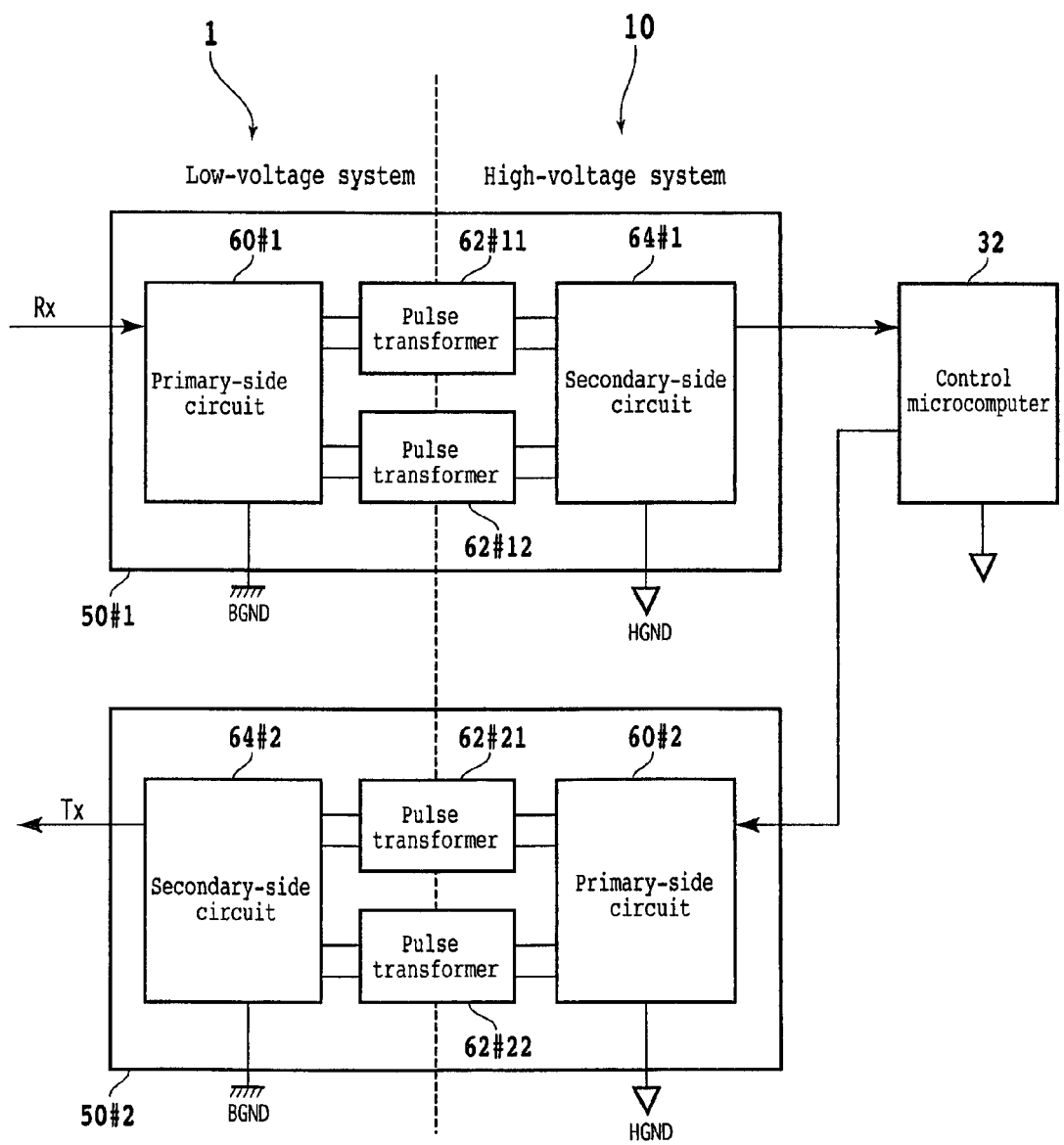
FIG. 4 is a functional block diagram of a high-speed signal insulator in FIG. 3.

FIG. 4 is a configuration diagram of the high-speed signal insulator 34 in FIG. 3. As shown in FIG. 4, the high-speed signal insulator 34 is composed of an insulating communication circuit 50#1 for the reception signal Rx and an insulating communication circuit 50#2 for the transmission signal Tx. The insulating communication circuit 50#1 has a primary-side circuit 60#1, a pulse transformer 62#11 for the communication signal, a pulse transformer 62#12 for the noise detection signal, and a secondary-side circuit 64#1.

The primary-side circuit 60#1 and the primary windings of the pulse transformers 62#11 and 62#12 are included in the low-voltage system 1 and connected to the low-voltage system ground BGND. The secondary winding side of the pulse transformers 62#11 and 62#12 and the secondary-side circuit 64#1 are included in the high-voltage system 10 and connected to the high-voltage system ground HGND.

The insulating communication circuit 50#2 has a primary-side circuit 60#2, a pulse transformer 62#21 for the communication signal, a pulse transformer 62#22 for the noise detection signal, and a secondary-side circuit 64#2. The primary-side circuit 60#2 and the primary windings of the pulse transformers 62#21 and 62#22 are included in the high-voltage system 10 and connected to the high-voltage system ground HGND. The secondary winding side of the pulse transformers 62#21 and 62#22 and the secondary-side circuit 64#2 are included in the low-voltage system 1 and connected to the low-voltage system ground BGND. The primary-side circuits 60#1 and 60#2 shown in FIG. 4 are circuits that transmit a signal and detect noise, and the secondary-side circuits 64#1 and 64#2 are circuits that receive a signal and noise.

Figure 5:
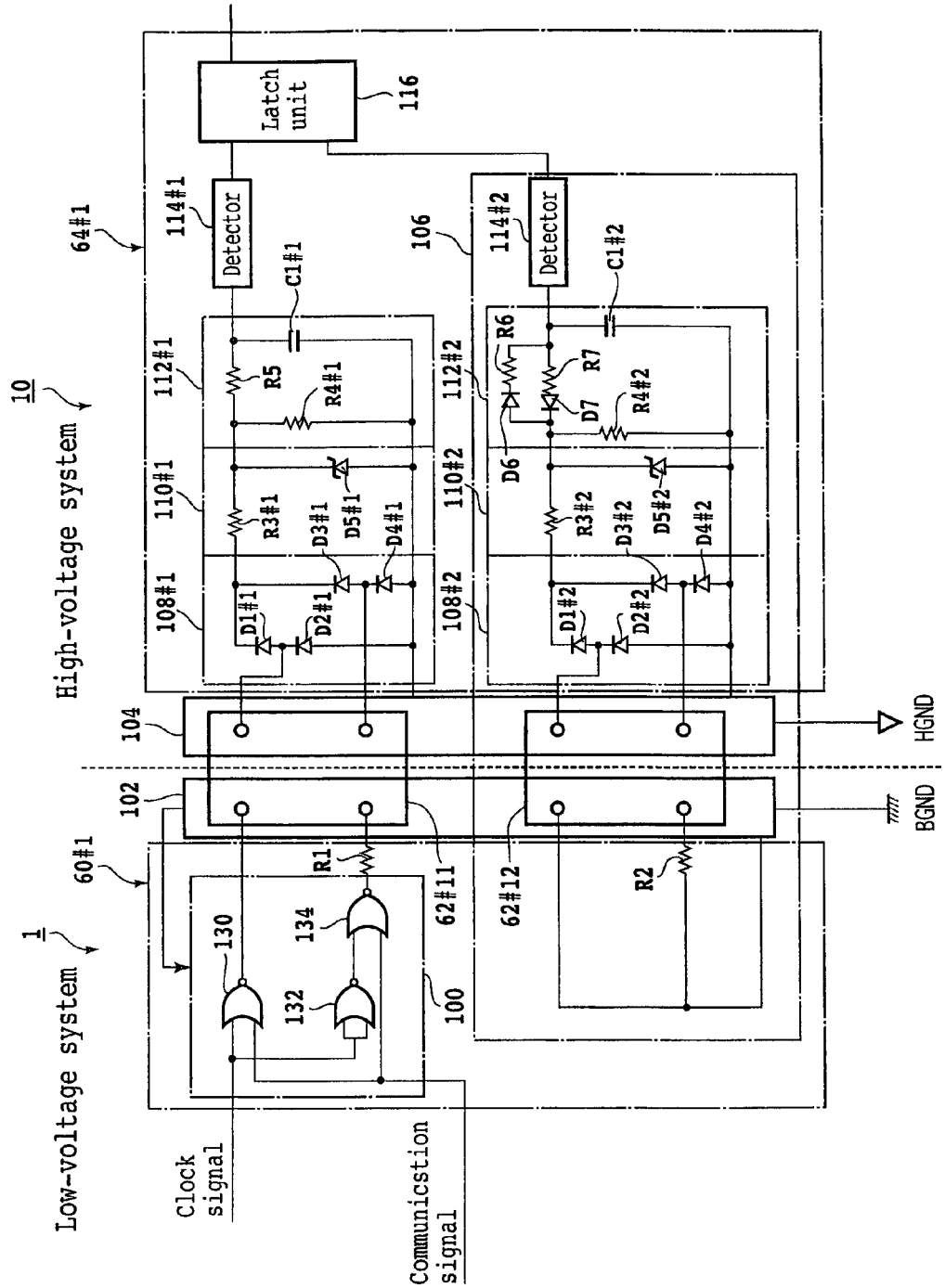
FIG. 5 is a configuration diagram of an insulating communication circuit in FIG. 4.

FIG. 5 is a configuration diagram of the insulating communication circuit 50#1 in FIG. 4. As shown in FIG. 5, the primary-side circuit 60#1 has a driver 100 and resistors R1 and R2. The driver (drive circuit) 100 is a circuit that drives the pulse transformer 62#11 based on the communication signal and the clock signal. For example, the driver 100 outputs '00' if the communication signal is '1.' If the communication signal is '0', the driver 100 outputs '10' when the level of the clock signal is '1', and outputs '01' when the level of the clock signal is '0.' The driver 100 is composed of NOR gates 130, 132, and 134.

The NOR gate 130 implements the NOR of the clock signal and the communication signal and outputs the resulting signal to a terminal connected to one end of the primary winding of the pulse transformer 62#11. The NOR gate 132 implements the NOR of the clock signal, i.e. inverts the clock signal, and outputs the resulting signal to the NOR gate 134. The NOR gate 134 implements the NOR of the output of the NOR gate 132 and the communication signal and outputs the resulting signal via the resistor R1 to a terminal connected to the other end of the primary winding of the pulse transformer 62#11.

The resistor R1 is a resistor for current adjustment of the pulse transformer 62#11 and circuit overcurrent protection. One end thereof is connected to the output side of the NOR gate 134, and the other end is connected to the terminal to which the other end of the primary winding of the pulse transformer 62#11 is connected.

The resistor R2 is a resistor for current adjustment of the pulse transformer 62#12 and circuit overcurrent protection. One end thereof is connected to the low-voltage system ground BGND via a conductor pattern 102, and the other end is connected to a terminal to which the other end of the primary winding of the pulse transformer 62#12 is connected. A terminal connected to one end of the primary winding of the pulse transformer 62#12 is connected to the low-voltage system ground BGND via the conductor pattern 102.

The conductor pattern 102 is formed over a substrate (not shown) and connected to the low-voltage system ground BGND. The low-voltage system ground BGND of the primary-side circuit 60#1 is connected to the conductor pattern 102. One end of the resistor R2 and one end of the primary winding of the pulse transformer 62#12 are connected to the conductor pattern 102. A conductor pattern 104 is formed over the substrate (not shown) and connected to the high-voltage system ground HGND.

The pulse transformer 62#11 is housed in an IC package. The primary winding side thereof is mounted on the conductor pattern 102, and the secondary winding side is mounted on the conductor pattern 104. One end of the primary winding is connected to the output terminal of the NOR gate 130, and the other end is connected to the other end of the resistor R1. The low-voltage system ground BGND of the drive circuit 100 is connected to the conductor pattern 102.

The pulse transformer 62#12 is housed in the IC package. The primary winding side thereof is mounted on the conductor pattern 102, and the secondary winding side is mounted on the conductor pattern 104. One end of the primary winding is connected to the conductor pattern 102, and the other end is connected to the other end of the resistor R2. The pulse transformers 62#11 and 62#12 are substantially identical to each other and are the same in the coupling capacitance between the primary winding and the secondary winding, the coil inductance, and the coil resistance.

In the primary-side circuit 60#1, the low-voltage system ground BGND is connected to the conductor pattern 102 for the communication signal and the noise detection signal, and thus the voltages of the low-voltage system ground BGND for these signals are equal to each other. Furthermore, in the secondary-side circuit 64#1, the high-voltage system ground HGND is connected to the conductor pattern 104 for the communication signal and the noise detection signal, and thus the voltages of the high-voltage system ground HGND for these signals are equal to each other. Therefore, noise on the communication signal due to a common mode current and the noise detection signal occur with the same phase, and thus the timing of the noise on the communication signal due to the common mode current is the same as that of the noise detection signal.

The secondary-side circuit 64#1 includes rectification circuits 108#$i$ ($i=1, 2$), protection circuits 110#$i$ ($i=1, 2$), delay time adjusters 112#$i$ ($i=1, 2$), detectors 114#$i$ ($i=1, 2$), and a latch unit 116.

The rectification circuit 108#$i$ ($i=1, 2$) full-wave rectifies the voltage across the secondary winding of the pulse transformer 62#1$i$ ($i=1, 2$), and has diodes D1#$i$ ($i=1, 2$), D2#$i$ ($i=1, 2$), D3#$i$ ($i=1, 2$), and D4#$i$ ($i=1, 2$).

The anodes of the diodes D2#$i$ ($i=1, 2$) and D4#$i$ ($i=1, 2$) are connected to the high-voltage system ground HGND, and the cathodes thereof are connected to the anodes of the diodes D1#$i$ ($i=1, 2$) and D3#$i$ ($i=1, 2$) and the secondary winding of the pulse transformer 62#1$i$ ($i=1, 2$).

The anodes of the diodes D1#$i$ ($i=1, 2$) and D3#$i$ ($i=1, 2$) are connected to the cathodes of the diodes D2#$i$ ($i=1, 2$) and D4#$i$ ($i=1, 2$) and the secondary winding of the pulse transformer 62#1$i$ ($i=1, 2$), and the cathodes thereof are connected to one end of a resistor R3#$i$ ($i=1, 2$).

When either one of the cathodes of the diodes D2#$i$ ($i=1, 2$) and D4#$i$ ($i=1, 2$) is at a high potential and the other is at a low potential, the diode D1#$i$ ($i=1, 2$) or D3#$i$ ($i=1, 2$) on the high potential side is turned ON, and the diode D2#$i$ ($i=1, 2$) or D4#$i$ ($i=1, 2$) on the high potential side is turned OFF. In addition, the diode D2#$i$ ($i=1, 2$) or D4#$i$ ($i=1, 2$) on the low potential side is turned ON, and the diode D1#$i$ ($i=1, 2$) or D3#$i$ ($i=1, 2$) on the low potential side is turned OFF.

When both of the cathodes of the diodes D2#$i$ ($i=1, 2$) and D4#$i$ ($i=1, 2$) are at a low potential, the diodes D2#$i$ ($i=1, 2$) and D4#$i$ ($i=1, 2$) are turned ON, and the diodes D1#$i$ ($i=1, 2$) and D3#$i$ ($i=1, 2$) are turned OFF. As a result, the terminal of the secondary winding on the low potential side is connected to the high-voltage system ground HGND and is biased.

The protection circuit 110#$i$ ($i=1, 2$) is a circuit that clamps the output of the rectification circuit 108#$i$ ($i=1, 2$) to a constant voltage when this output surpasses a certain voltage, and has the resistor R3#$i$ ($i=1, 2$) and a zener diode D5#$i$ ($i=1, 2$). One end of the resistor R3#$i$ ($i=1, 2$) is connected to the cathodes of the diodes D1#$i$ ($i=1, 2$) and D3#$i$ ($i=1, 2$), and the other end thereof is connected to the cathode of the zener diode D5#$i$ ($i=1, 2$) and the input side of the delay time adjuster 112#$i$ ($i=1, 2$).

The zener diode D5#$i$ ($i=1, 2$) is a circuit that clamps the output of the rectification circuit 108#$i$ ($i=1, 2$) to a constant voltage when this output surpasses a certain voltage. The anode thereof is connected to the high-voltage system ground HGND, and the cathode is connected to the other end of the resistor R3#$i$ ($i$=1, 2) and the input side of the delay time adjuster 112#$i$ ($i$=1, 2).

The delay time adjusters 112#1 and 112#2 are circuits that adjust the transmission speeds (delay times) of the communication signal and the noise detection signal in such a way that the transmission speed of the noise detection signal is set higher than that of the communication signal at the start of common mode noise and the transmission speed of the noise detection signal is set lower than that of the communication signal at the end of the common mode noise. If e.g. a series RC circuit is employed as the circuit for adjusting the delay time, the delay time is adjusted based on the time constant $\tau$ (resistance R×capacitance C) of the RC circuit.

At a time when the output level of the delay time adjuster 112#2 surpasses a reference voltage Vth and the output of the detector 114#2 becomes the low level (because the level of the noise detection signal is inverted by the detector 114#2) and thus it is determined that common mode noise has started, the communication signal whose voltage change is further delayed compared with the noise detection signal and before the detection of the common mode noise and the change of its binary level of High/Low is output to the detector 114#1. This communication signal is latched by the latch unit 116 until the output level of the delay time adjuster 112#2 becomes lower than the reference voltage Vth and the output of the detector 114#2 becomes the high level, so that the noise on the communication signal is suppressed.

Furthermore, at a time when the output level of the delay time adjuster 112#2 becomes lower than the reference voltage Vth and the output of the detector 114#2 becomes the high level and thus it is determined that the common mode noise is cancelled, the communication signal whose delay time is set shorter than that of the noise detection signal and after the change of its binary level is output from the latch unit 116 to the detector 114#1, so that the noise on the communication signal is suppressed.

The time constants $\tau 1$ to $\tau 4$ are so decided as to satisfy the following inequalities (1) and (2) because common mode noise has polarity. The definitions of the respective time constants $\tau 1$ to $\tau 4$ are as follows: $\tau 1$ is the time constant of the RC circuit relating to the rising of the noise detection signal (charging of the capacitor) in the delay time adjuster 112#2; $\tau 2$ is the time constant of the RC circuit relating to the falling of the noise detection signal (discharging of the capacitor) in the delay time adjuster 112#2; $\tau 3$ is the time constant at the time of charging of the capacitor in the delay time adjuster 112#1; and $\tau 4$ is the time constant at the time of discharging of the capacitor in the delay time adjuster 112#1.

$$\tau 1 < \tau 3 \text{ and } \tau 1 < \tau 4 \quad (1)$$

$$\tau 2 > \tau 3 \text{ and } \tau 2 > \tau 4 \quad (2)$$

The delay time adjuster 112#1 has resistors R4#1 and R5 and a capacitor C1#1. The resistor R4#1 is a resistor for discharging the charge in the capacitor C1#1. One end thereof is connected to the output side of the protection circuit 110#1 and one end of the resistor R5, and the other end is connected to the high-voltage system ground HGND. The resistor R5 is a resistor for charging and discharging. One end thereof is connected to the output side of the protection circuit 110#1 and one end of the resistor R4#1, and the other end is connected to the positive electrode of the capacitor C1#1 and the input side of the detector 114#1. The positive electrode of the capacitor C1#1 is connected to the other end of the resistor R5 and the input side of the detector 114#1, and the negative electrode thereof is connected to the high-voltage system ground HGND.

At the time of charging, an RC circuit is formed by the resistor R5 and the capacitor C1#1. At the time of discharging, an RC circuit is formed by the resistors R5 and R4#1 and the capacitor C1#1. The time constants $\tau 3$ and $\tau 4$ are represented by the following equations: $\tau 3 = R5 \times C1\#1$ and $\tau 4 = (R4\#1 + R5) \times C1\#1$.

The delay time adjuster 112#2 has resistors R4#2, R6, and R7, diodes D6 and D7, and a capacitor C1#2. The resistor R4#2 is a resistor for discharging the charge in the capacitor C1#2. One end thereof is connected to the output side of the protection circuit 110#2, the anode of the diode D6, and the cathode of the diode D7, and the other end is connected to the high-voltage system ground HGND.

The diode D6 is a diode that is turned ON at the time of charging. The anode thereof is connected to the output side of the protection circuit 110#2, one end of the resistor R4#2, and the cathode of the diode D7, and the cathode is connected to one end of the resistor R6. The resistor R6 is a resistor for charging the capacitor C1#2. One end thereof is connected to the cathode of the diode D6, and the other end is connected to the other end of the resistor R7, the positive electrode of the capacitor C1#2, and the input side of the detector 114#2.

The diode D7 is a diode that is turned ON at the time of discharging. The anode thereof is connected to one end of the resistor R7, and the cathode is connected to the anode of the diode D6, one end of the resistor R4#2, and the output side of the protection circuit 110#2. The resistor R7 is a resistor for discharging the charge in the capacitor C1#2. One end thereof is connected to the anode of the diode D7, and the other end is connected to the other end of the resistor R6, the positive electrode of the capacitor C1#2, and the input side of the detector 114#2. The positive electrode of the capacitor C1#2 is connected to the other ends of the resistors R6 and R7 and the input side of the detector 114#2, and the negative electrode thereof is connected to the high-voltage system ground HGND.

At the time of charging, the diode D6 is turned ON and an RC circuit is formed by the resistor R6 and the capacitor C1#2. At the time of discharging, the diode D7 is turned ON and an RC circuit is formed by the resistors R7 and R4#2 and the capacitor C1#2, which are connected in series. The time constants $\tau 1$ and $\tau 2$ are represented by the following equations: $\tau 1 = R6 \times C1\#2$ and $\tau 2 = (R4\#2 + R7) \times C1\#2$. If C1#1 is equal to C1#2, the following relationships are satisfied because of the inequalities (1) and (2): R6<R5 and (R7+R4#2)>(R5+R4#1). Diodes for switching the time constant between that at the time of charging and that at the time of discharging may be provided in the delay time adjuster 112#1.

The detector 114#$i$ ($i$=1, 2) compares an input signal from the delay time adjuster 112#$i$ ($i$=1, 2) with the reference voltage Vth. The detector 114#$i$ ($i$=1, 2) outputs the low level when the input signal is equal to or higher than the reference voltage Vth, and it outputs the high level when the input signal is lower than the reference voltage Vth.

The latch unit 116 latches the output of the detector 114#1 when a latch enable signal output from the detector 114#2 is at the low level, and it allows the passage of the output of the detector 114#1 therethrough when the latch enable signal is at the high level. The output of the latch unit 116 is input to the control microcomputer 32 in FIG. 3.

The resistor R2, the pulse transformer 62#12, the rectification circuit 108#2, the protection circuit 110#2, the delay time adjuster 112#2, and the detector 114#2 form a noise detection circuit 106. The resistor R2, the interconnect that connects one end of the resistor R2 and one end of the pulse transformer 62#12 to the low-voltage system ground BGND via the conductor pattern 102, and the interconnect that connects the other end of the pulse transformer 62#12 to the other end of the resistor R2 form a primary-side noise detection circuit that is so configured that a common mode current flows between the primary winding and the secondary winding of the pulse transformer 62#12 via the coupling capacitance between the primary winding and the secondary winding.

The rectification circuit 108#2, the protection circuit 110#2, the delay time adjuster 112#2, and the detector 114#2 form a secondary-side noise detection circuit. The rectification circuit 108#1, the protection circuit 110#1, the delay time adjuster 112#1, and the detector 114#1 form a secondary-side signal detection circuit.

The control microcomputer 32 generates the gate signal based on the communication signal and outputs it to the gate drivers 22.

Figure 6:
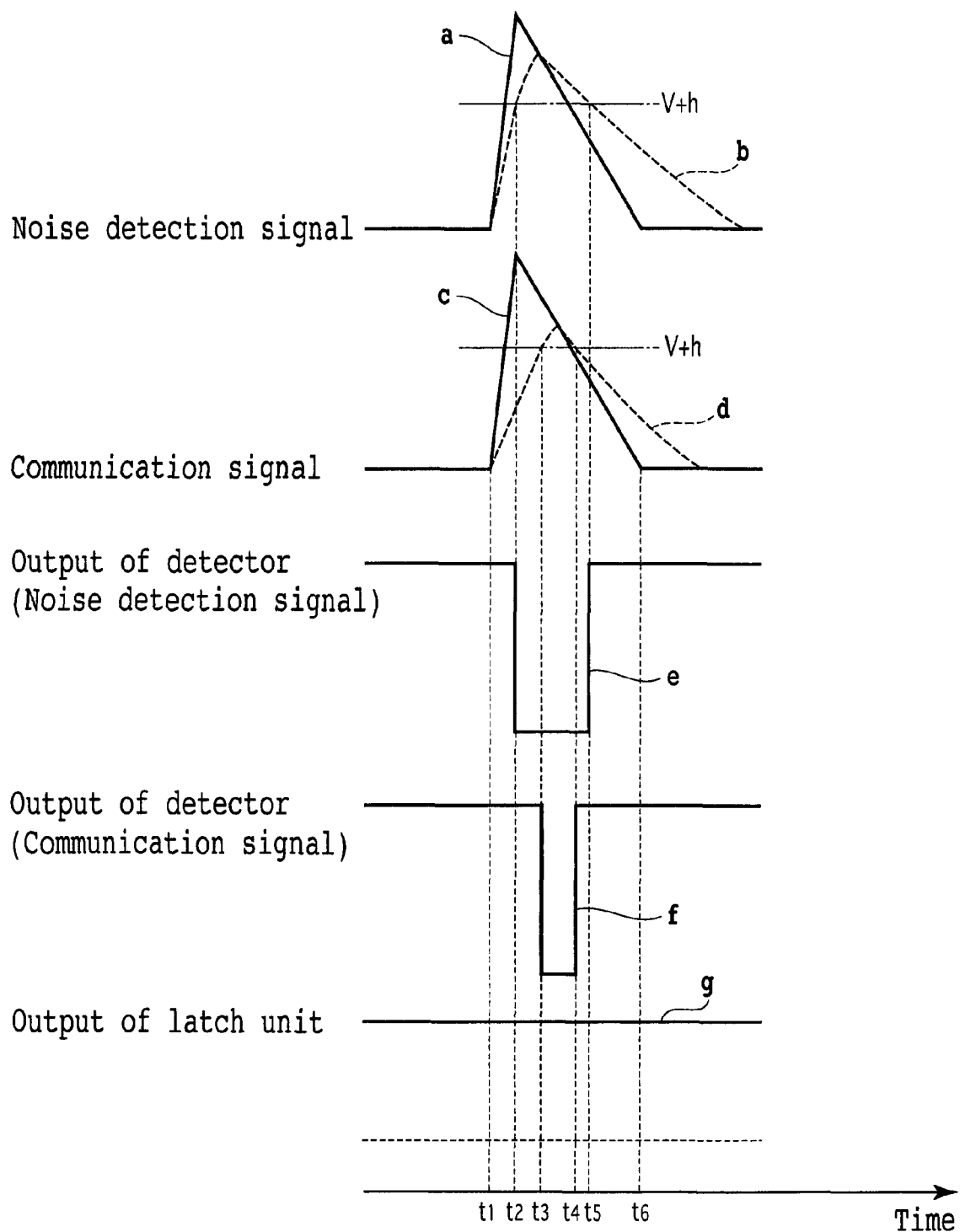
FIG. 6 is a time chart based on the first embodiment of the present invention.

FIG. 6 is a time chart showing the operation of the insulating communication circuit 50#1. In FIG. 6, symbol a indicates the noise detection signal input to the delay time adjuster 112#2, and symbol b indicates the output signal of the delay time adjuster 112#2. Furthermore, symbol c indicates the communication signal to which common mode noise is added as the high-level communication signal input to the delay time adjuster 112#1 (this communication signal is at the low level because it is inverted by the driver 100), and symbol d indicates the output signal of the delay time adjuster 112#1. In addition, symbol e indicates the output signal of the detector 114#2, symbol f indicates the output signal of the detector 114#1, and symbol g indicates the output signal of the latch unit 116.

With reference to FIG. 6, the operation of the insulating communication circuit 50#1 will be described below. The driver 100 outputs a drive pulse to both the ends of the primary winding of the pulse transformer 62#11 based on the communication signal and the clock signal in the following manner. Specifically, (i) when the communication signal is at the low level, the driver 100 outputs a drive pulse of (1, 0) when the level of the clock signal is the high level, and outputs a drive pulse of (0, 1) when the level of the clock signal is the low level. (ii) When the communication signal is at the high level, the driver 100 outputs a drive pulse of (0, 0).

The reason why the communication signal is inverted is that the output signal is inverted by the detector 114#1. A voltage is applied to both the ends of the primary winding of the pulse transformer 62#11 due to the drive pulse, and a voltage is induced across the secondary winding due to the voltage applied to the primary winding. The diode D1#1 or D3#1 on the high level side is turned ON, and the diode D2#1 or D4#1 on the high level side is turned OFF. Furthermore, the diode D4#1 or D2#1 on the low level side is turned ON, and the diode D3#1 or D1#1 on the low level side is turned OFF. If both are at the low level, the diodes D1#1 and D3#1 are turned OFF, and the diodes D2#1 and D4#1 are turned ON.

Figure 7:
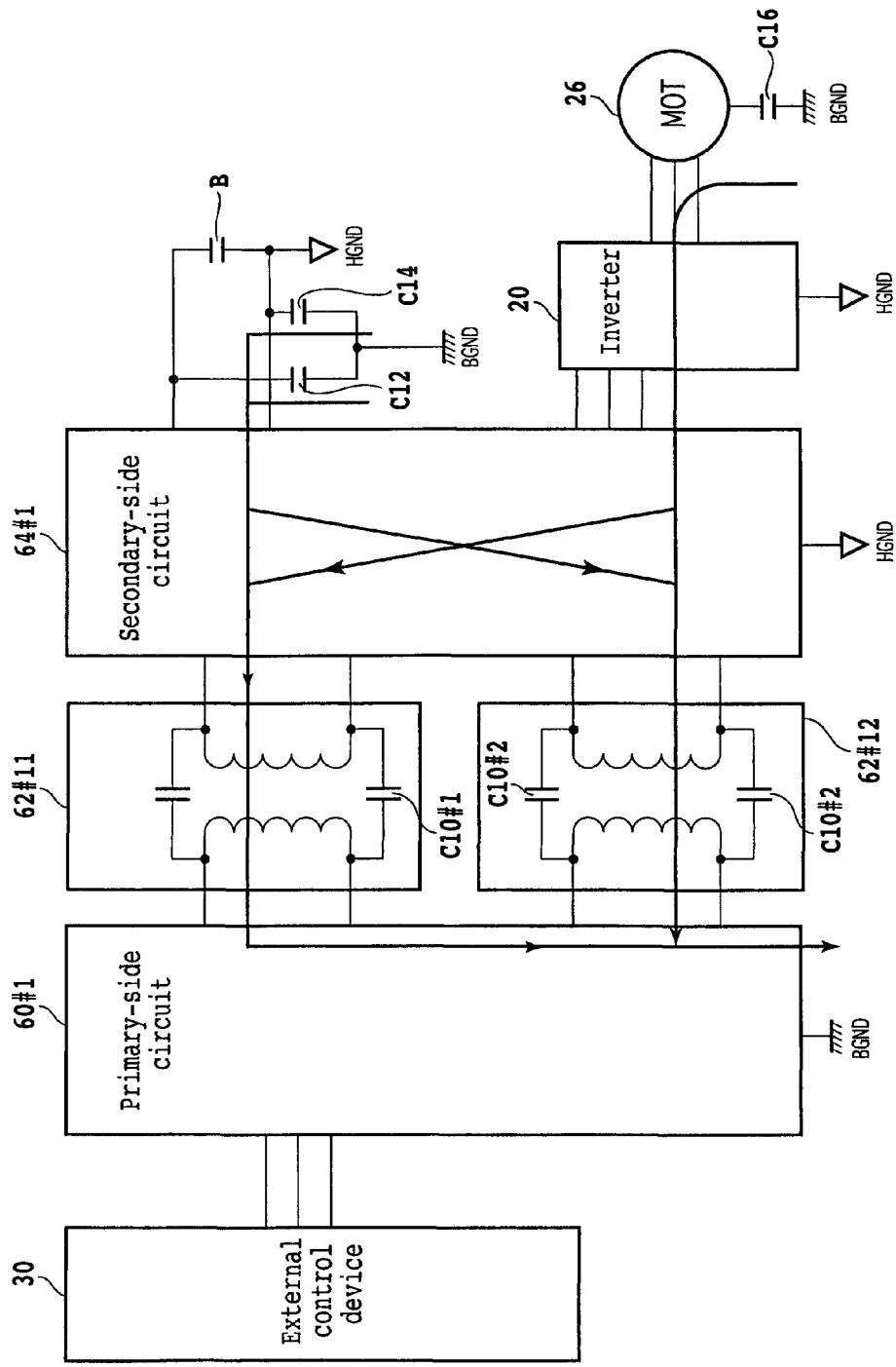
FIG. 7 is a diagram showing the flow of a common mode current.

If the potential of the high-voltage system ground HGND changes due to the switching-ON/OFF of the switch elements 22 and thus the voltage between the high-voltage system ground HGND and the low-voltage system ground changes, the voltage between the primary winding and the secondary winding of the pulse transformer 62#12 changes. The primary winding and the secondary winding of the pulse transformer 62#12 have coupling capacitance C10#2 therebetween. Due to this voltage change, through the path shown in FIG. 7, a common mode current flows from the secondary-side circuit 64#1 to the low-voltage system ground BGND via the secondary winding, the coupling capacitance C10#2, and the primary winding of the pulse transformer 62#12. In FIG. 7, symbol C12 indicates the capacitance between the high-voltage line connected to the positive electrode of the high-voltage power supply B and the low-voltage system ground or the capacitance of a Y-capacitor. Symbol C14 indicates the capacitance between the ground line connected to the negative electrode of the high-voltage power supply B and the low-voltage system ground or the capacitance of the Y-capacitor. Symbol C16 indicates the capacitance between the coils of the motor 26 and the low-voltage system ground.

Similarly, via the coupling capacitance C10#2, a common mode current flows from the low-voltage system ground BGND of the primary-side circuit 60#1 to the primary winding, the coupling capacitance C10#2, and the secondary winding of the pulse transformer 62#12. For example, a common mode current flows to the noise detection circuit 106 at a time t1 in FIG. 6.

If the common mode current flows to the secondary winding and the primary winding of the pulse transformer 62#12, a voltage arises across the primary winding and the secondary winding due to the coil inductance and the coil resistance of the secondary winding and the primary winding, and the resistor R2. The diode D1#2 or D3#2 on the high potential side is turned ON, and the diode D2#2 or D4#2 on the high potential side is turned OFF. Furthermore, the diode D4#2 or D2#2 on the low potential side is turned ON, and the diode D3#2 or D1#2 on the low potential side is turned OFF.

Furthermore, due to change in the voltage between the primary winding and the secondary winding of the pulse transformer 62#11, a common mode current flows to the secondary winding and the primary winding of the pulse transformer 62#11 via coupling capacitance C10#1. Thus, a voltage arises across the primary winding and the secondary winding of the pulse transformer 62#11 due to the coil inductance and the coil resistance of the secondary winding and the primary winding, and the resistor R1. Accordingly, noise due to the common mode current is added to the communication signal.

In the primary-side circuit 60#1, the low-voltage system ground BGND for the communication signal and the noise detection signal is connected to the conductor pattern 102. In the secondary-side circuit 64#1, the high-voltage system ground HGND for the communication signal and the noise detection signal is connected to the conductor pattern 104. Therefore, the noise on the communication signal is in the same phase as that of the noise detection signal. For example, the noise due to the common mode current is added to the communication signal at the time t1.

The rectification circuit 108#1 full-wave rectifies the voltage across the pulse transformer 62#11. The rectification circuit 108#2 full-wave rectifies the voltage across the pulse transformer 62#12. If the output of the rectification circuit 108#1 surpasses a certain voltage, the protection circuit 110#1 clamps this output to a constant voltage, and outputs the resulting voltage to the delay time adjuster 112#1. For example, the input to the delay time adjuster 112#1 has a waveform like that indicated by symbol c in FIG. 6. If the output of the rectification circuit 108#2 surpasses a certain voltage, the protection circuit 110#2 clamps this output to a constant voltage, and outputs the noise detection signal to the delay time adjuster 112#2. For example, the input to the delay time adjuster 112#2 has a waveform like that indicated by symbol a in FIG. 6.

At the time of the rising of the noise detection signal, the diode D6 in the delay time adjuster 112#2 is turned ON and the delay time adjuster 112#2 delays the rising of the noise detection signal in accordance with the time constant τ1 of the RC circuit formed of the resistor R6 and the capacitor C1#2. For example, the output of the delay time adjuster 112#2 has a waveform like that indicated by symbol b in FIG. 6.

The delay time adjuster 112#1 delays the communication signal in accordance with the time constant τ3 of the RC circuit formed of the resistor R5 and the capacitor C1#1 or the time constant τ4 of the RC circuit formed of the resistors R5 and R4#1 and the capacitor C1#1. For example, the output of the delay time adjuster 112#1 has a waveform like that indicated by symbol d in FIG. 6.

Because the time constants satisfy the relationship τ1<τ3, τ4, the delay time of the voltage level change (hereinafter, the level change) of the communication signal is longer than that of the rising of the noise detection signal, and thus the rising of the noise detection signal is earlier than the level change of the communication signal due to the noise. For example, as indicated by symbols b and d in FIG. 6, the rising of the noise detection signal is earlier than the rising of the noise added to the communication signal. The outputs of the delay time adjusters 112#1 and 112#2 are input to the detectors 114#1 and 114#2.

At the time of the falling of the noise detection signal, the diode D7 in the delay time adjuster 112#2 is turned ON and the delay time adjuster 112#2 delays the falling of the noise detection signal in accordance with the time constant τ2 of the RC circuit formed of the resistors R7 and R4#2 and the capacitor C1#2.

The delay time adjuster 112#1 delays the communication signal in accordance with the time constant τ3 of the RC circuit formed of the resistor R5 and the capacitor C1#1 or the time constant τ4 of the RC circuit formed of the resistors R5 and R4#1 and the capacitor C1#1.

Because the time constants satisfy the relationship τ2>τ3, τ4, the delay time of the communication signal is shorter than that of the noise detection signal, and thus the falling of the noise detection signal is later than the level change of the communication signal due to the noise. For example, as indicated by symbols b and d in FIG. 6, the falling of the noise detection signal is later than the falling of the communication signal.

The outputs of the delay time adjusters 112#1 and 112#2 are input to the detectors 114#1 and 114#2. The detector 114#1 outputs the low level when the input signal is equal to or higher than the reference voltage Vth, and outputs the high level when the input signal is lower than the reference voltage Vth. The detector 114#2 outputs the low level when the input signal is equal to or higher than the reference voltage Vth, and outputs the high level when the input signal is lower than the reference voltage Vth.

For example, as indicated by symbol b in FIG. 6, the level of the noise detection signal becomes equal to or higher than the reference voltage Vth at a time t2. Thereupon, the output of the detector 114#2 becomes the low level as indicated by symbol e in FIG. 6. As indicated by symbol d in FIG. 6, the level of the communication signal becomes equal to or higher than the reference voltage Vth at a time t3. Thereupon, the output of the detector 114#1 becomes the low level as indicated by symbol f in FIG. 6.

Because the delay times of the noise detection signal and the communication signal are so adjusted that the rising of the noise detection signal is earlier than the level change of the communication signal, the time t2, when the level of the noise detection signal becomes equal to or higher than the reference voltage Vth, is earlier than the time t3, when the level of the communication signal becomes equal to or higher than the reference voltage Vth. Therefore, at the time t2, the level of the communication signal output from the detector 114#1 is still the high level, i.e. the level before the noise is detected, as indicated by symbol f. That is, the time t2, when the binary level of the noise detection signal changes to the high level, is earlier than the time t3, when the binary level of the communication signal changes.

As for the falling of the noise detection signal, as indicated by symbol b in FIG. 6, the level of the noise detection signal becomes lower than the reference voltage Vth at a time t5. Thereupon, the output of the detector 114#2 becomes the high level as indicated by symbol e in FIG. 6. As indicated by symbol d in FIG. 6, the level of the communication signal input to the detector 114#1 becomes lower than the reference voltage Vth at a time t4. Thereupon, the output of the detector 114#1 becomes the high level as indicated by symbol f in FIG. 6.

Because the delay times of the noise detection signal and the communication signal are so adjusted that the falling of the noise detection signal is later than the level change of the communication signal, the time t5, when the level of the noise detection signal becomes lower than the reference voltage Vth, is later than the time t4, when the level of the communication signal becomes lower than the reference voltage Vth. Therefore, at the time t5, the level of the communication signal output from the detector 114#1 is the high level, i.e. the level after the noise is cancelled.

The latch unit 116 latches the output of the detector 114#1 when the latch enable signal output from the detector 114#2 is at the low level, and it allows the passage of the output of the detector 114#1 therethrough when the latch enable signal is at the high level. For example, as indicated by symbol g in FIG. 6, the latch unit 116 latches the output at the time t2 and outputs the high level. Furthermore, the latch unit 116 outputs the output of the detector 114#1, i.e. the high level, at the time t5. In this way, the noise on the communication signal is blocked.

Figure 8:
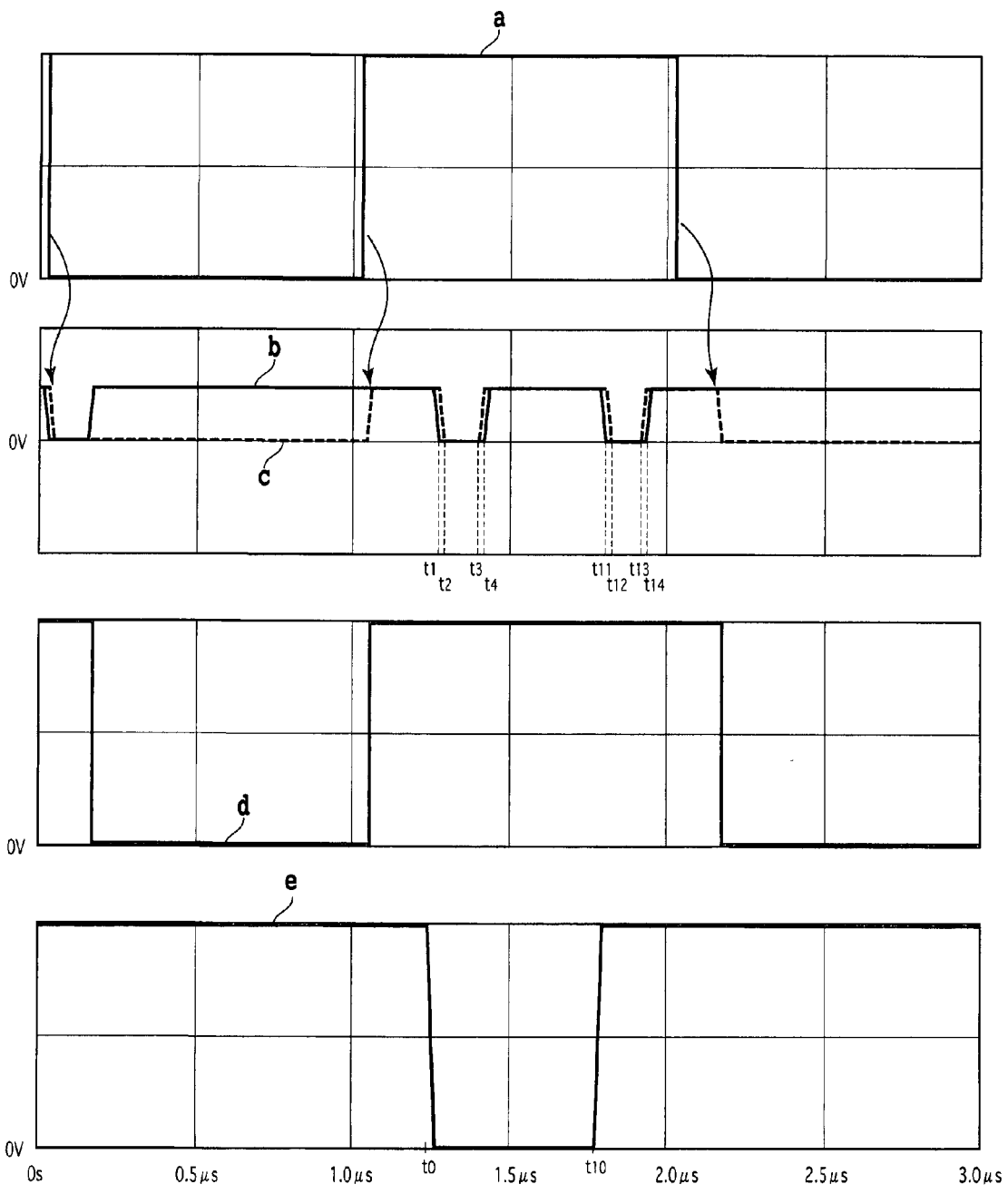
FIG. 8 is a diagram showing a simulation result.

FIG. 8 is a diagram showing a simulation result. In FIG. 8, symbol a indicates the communication signal, symbol b indicates the output of the detector 114#2, and symbol c indicates the output of the detector 114#1. In addition, symbol d indicates the output of the latch unit 116, and symbol e indicates the voltage between the high-voltage system ground HGND and the low-voltage system ground BGND. For example, the voltage between the high-voltage system ground HGND and the low-voltage system ground BGND changes at times t0 and t10.

Due to this voltage change, a common mode current flows via the coupling capacitance between the primary winding and the secondary winding of the pulse transformer 62#12, so that the noise detection signal is input to the delay time adjuster 112#2. In addition, noise in the same phase as that of the noise detection signal is added to the communication signal, and the resulting signal is input to the delay time adjuster 112#1.

The delay time adjusters 112#1 and 112#2 adjust delay times in such a way that the rising of the noise detection signal is set earlier than the level change of the communication signal, and output the signals to the detectors 114#1 and 114#2. Furthermore, the delay time adjusters 112#1 and 112#2 adjust delay times in such a way that the falling of the noise detection signal is set later than the level change of the communication signal, and output the signals to the detectors 114#1 and 114#2. The detectors 114#1 and 114#2 output the low level when the input signal is equal to or higher than the reference voltage Vth, and output the high level when the input signal is lower than the reference voltage Vth. During the period when the signal indicated by symbol b in FIG. 8 is at the low level, the level of the noise detection signal is equal to or higher than the reference voltage Vth.

As a result, as indicated by symbols b and c, times t2 and t12, when the output of the detector 114#1 is switched from the high level to the low level, are later than times t1 and t11, when the output of the detector 114#2 is switched from the high level to the low level. Therefore, as indicated by symbol d, it is apparent that the output of the latch unit 116 is not affected by the noise, because the output of the detector 114#1 is still at the high level, which is kept until a timing immediately before the noise is detected, at the times t1 and t11, when the output of the detector 114#2 becomes the low level and the latch enable signal becomes activated.

Furthermore, times t3 and t13, when the output of the detector 114#1 is switched from the low level to the high level, are earlier than times t4 and t14, when the output of the detector 114#2 is switched from the low level to the high level. Therefore, as indicated by symbol d, it is apparent that the output of the latch unit 116 is not affected by the noise, because the output of the detector 114#1 has been changed to the level after the noise period is ended at the times t4 and t14, when the output of the detector 114#2 becomes the high level and the latch enable signal becomes inactivated.

The control microcomputer 32 generates the gate signals in accordance with a PWM system based on the communication signal and outputs them to the switch elements 24 via the gate drivers 22.

The circuit configuration of the primary-side circuit 60#2 in FIG. 4 is substantially the same as that of the primary-side circuit 60#1 except that the ground thereof is the high-voltage system ground HGND. The configuration of the secondary-side circuit 64#2 is substantially the same as that of the secondary-side circuit 64#1 except that the ground thereof is the low-voltage system ground BGND.

The pulse transformer 62#21 is substantially the same as the pulse transformer 62#11, and the pulse transformer 62#22 is substantially the same as the pulse transformer 62#12. Thus, the insulating communication circuit can be applied also to transmission of a communication signal by use of pulse transformers from the control microcomputer 32 in the high-voltage system 10 to the CAN transceiver 31 in the low-voltage system 1.

As described above, in the embodiment of the present invention, common mode noise is detected and the passage of the noise added to the communication signal is blocked based on the noise detection signal, without using a filter. Therefore, the delay time is not critical and high-speed communication can be carried out without the occurrence of a communication error such as a bit error. Furthermore, the noise can be blocked even when the level of the noise detection signal is high, because the noise is not removed by using a filter. In addition, the insulating communication circuit can be formed by using not expensive parts such as a photocoupler but pulse transformers, which are more inexpensive. In the present embodiment, a CAN signal is employed as an example of the communication signal. However, the communication signal is not limited to the CAN signal but may be any signal as long as it is a communication signal specified by a predetermined interface. Furthermore, the embodiment of the present invention can be employed when communication is carried out between two circuits having different grounds by using a pulse transformer.

Moreover, also when insulated communication is carried out between circuits having different grounds by using an insulating circuit other than a pulse transformer, any component can be applied to the insulating circuit instead of the pulse transformer as long as it has a configuration that allows addition of noise to a communication signal due to a common mode current.

Second Embodiment

Figure 9:
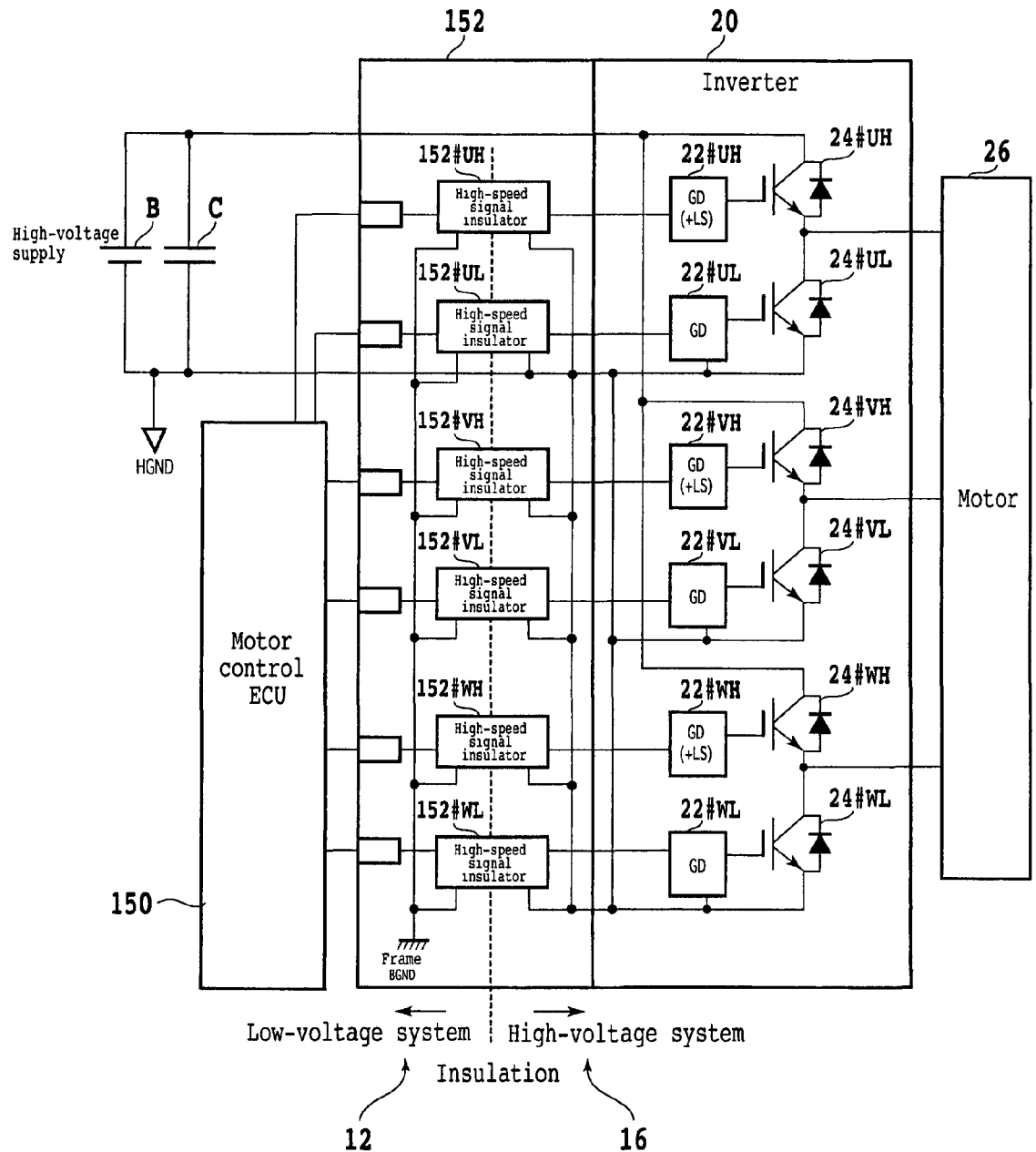
FIG. 9 is a schematic configuration diagram of an electric vehicle according to a second embodiment of the present invention.

FIG. 9 is a schematic configuration diagram of a hybrid vehicle as an electric vehicle showing a second embodiment of the present invention corresponding to FIG. 1B. In FIG. 9, the components that are substantially the same as those in FIG. 2 are given the same numerals and symbols. A motor control ECU 150 as the controller 14 in FIG. 1B is included in the low-voltage system 12. High-speed signal insulators 152#i (i=UH, UL, VH, VL, WH, WL (hereinafter, numeral 152)) are provided between the motor control ECU 150 and the gate drivers 22#i (i=UH, UL, VH, VL, WH, WL (hereinafter, numeral 22)) included in the high-voltage system 16.

Figure 10:
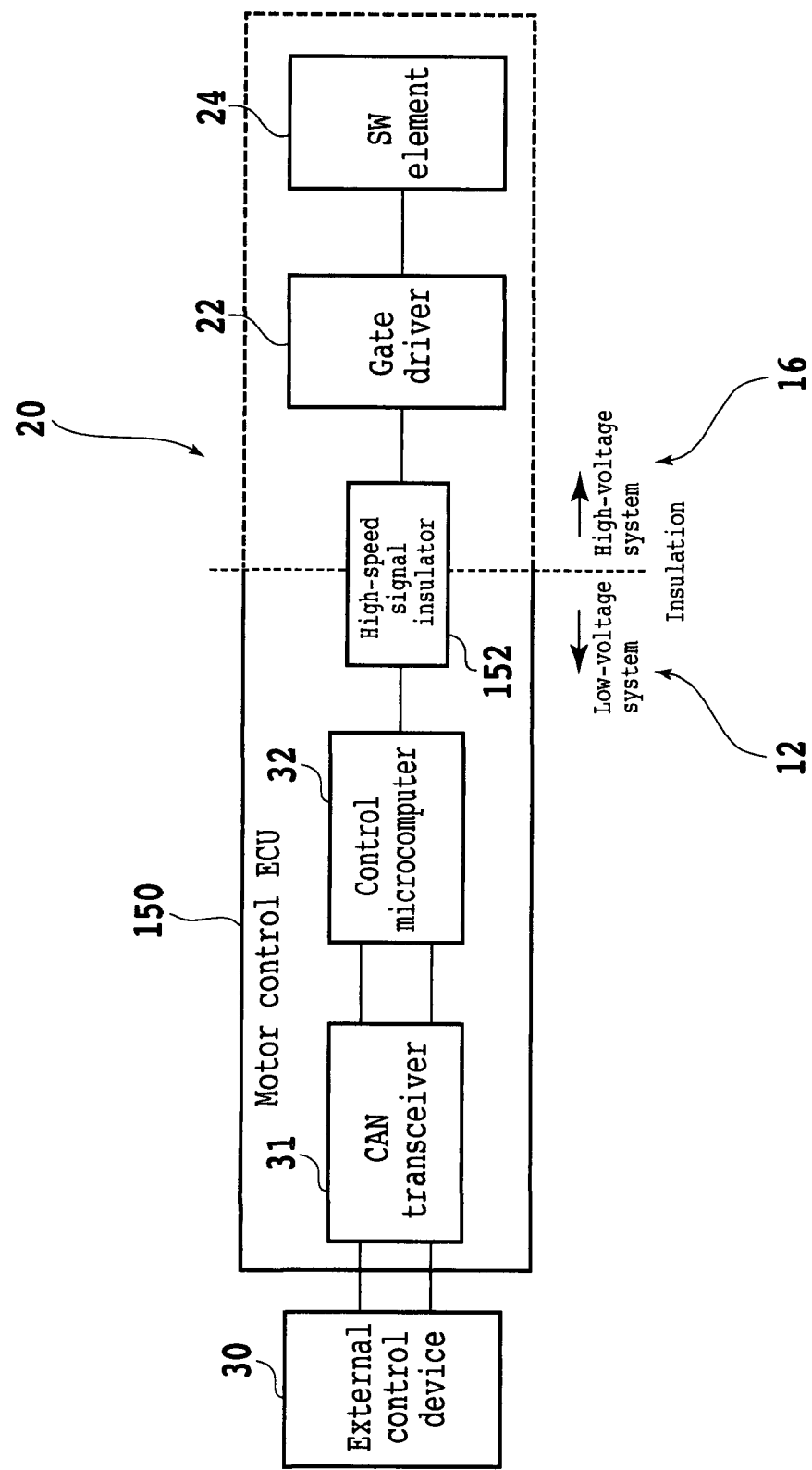
FIG. 10 is a diagram showing a motor control ECU in FIG. 9.

FIG. 10 is a diagram showing a configuration example of the motor control ECU 150 in FIG. 9. In FIG. 10, the components that are substantially the same as those in FIG. 3 are given the same numerals. The high-speed signal insulator 152 is provided between the output side of the control microcomputer 32 and the gate drivers 22. Upon receiving a torque command value from the external control device 30 via the CAN transceiver 31, the motor control ECU 150 generates gate signals to be applied to the gates of the SW elements 24#i (i=UH, UL, VH, VL, WH, WL) based on a PWM modulation system, and outputs the gate signals to the high-speed signal insulator 152.

Figure 11:
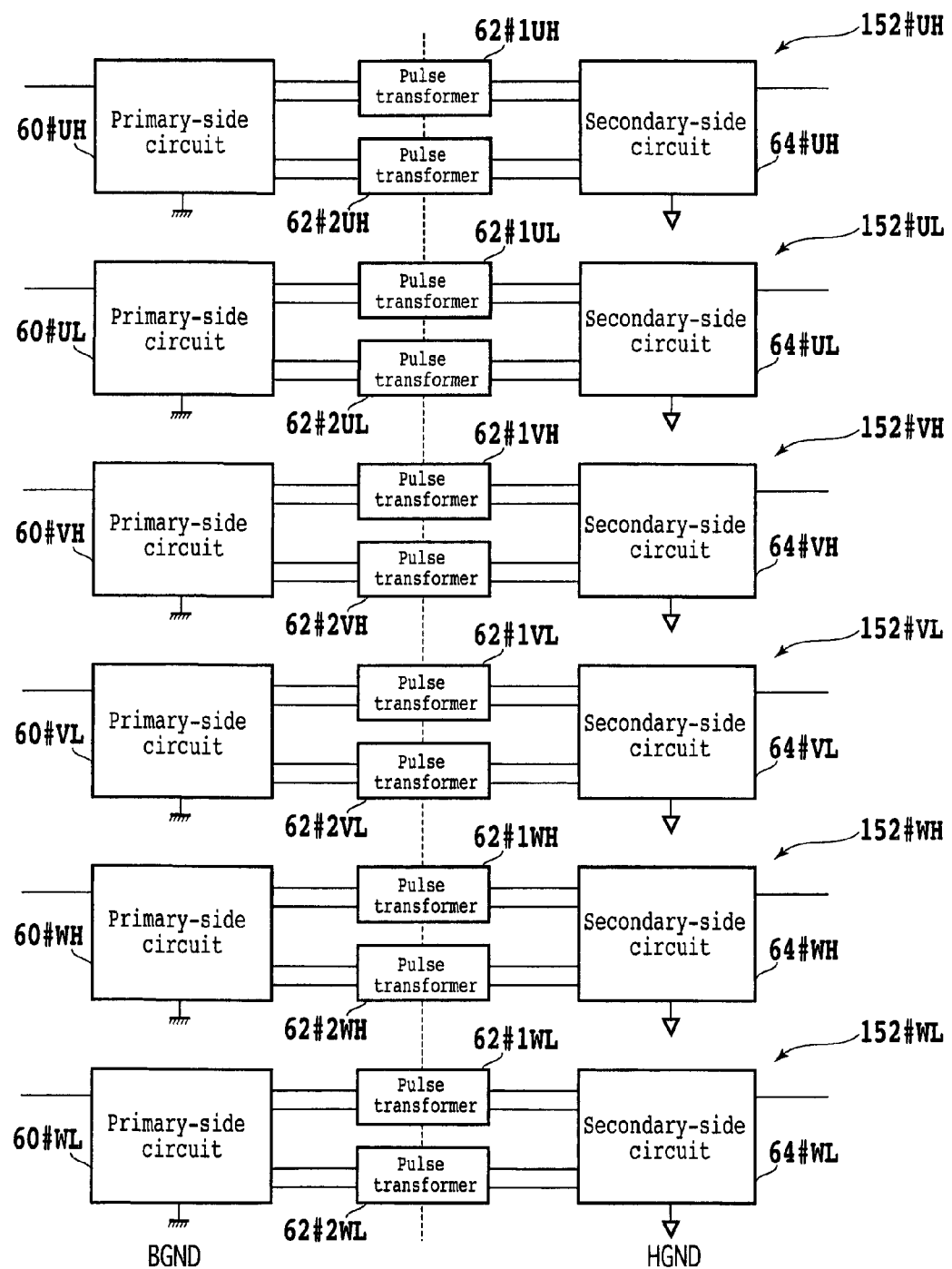
FIG. 11 is a functional block diagram of a high-speed signal insulator according to the second embodiment of the present invention.

FIG. 11 is a diagram showing a configuration example of the high-speed signal insulator 152 in FIG. 10. As shown in FIG. 11, the high-speed signal insulator 152#i (i=UH, UL, VH, VL, WH, WL) has a primary-side circuit 60#i (i=UH, UL, VH, VL, WH, WL), pulse transformers 62#1i (i=UH, UL, VH, VL, WH, WL) and 62#2i (i=UH, UL, VH, VL, WH, WL), and a secondary-side circuit 64#i (i=UH, UL, VH, VL, WH, WL).

The primary-side circuits 60#i (i=UH, UL, VH, VL, WH, WL) are substantially the same as the primary-side circuit 60#1 in FIG. 4. The primary-side circuitry for the communication signal and the primary-side circuitry for the noise detection signal are connected to the common low-voltage system ground BGND by a conductor pattern.

The secondary-side circuits 64#i (i=UH, UL, VH, VL, WH, WL) are substantially the same as the secondary-side circuit 64#1 in FIG. 4. The secondary-side circuitry for the communication signal and the secondary-side circuitry for the noise detection signal are connected to the common high-voltage system ground HGND by a conductor pattern. Due to such a configuration, also when the motor control ECU 150 is included in the low-voltage system 12 and the gate signals are transmitted from the low-voltage system 12 to the high-voltage system 16, noise added to the gate signals due to a common mode current can be blocked based on the noise detection signal, and thus the same advantages as those of the first embodiment can be achieved.

Third Embodiment

Figure 12:
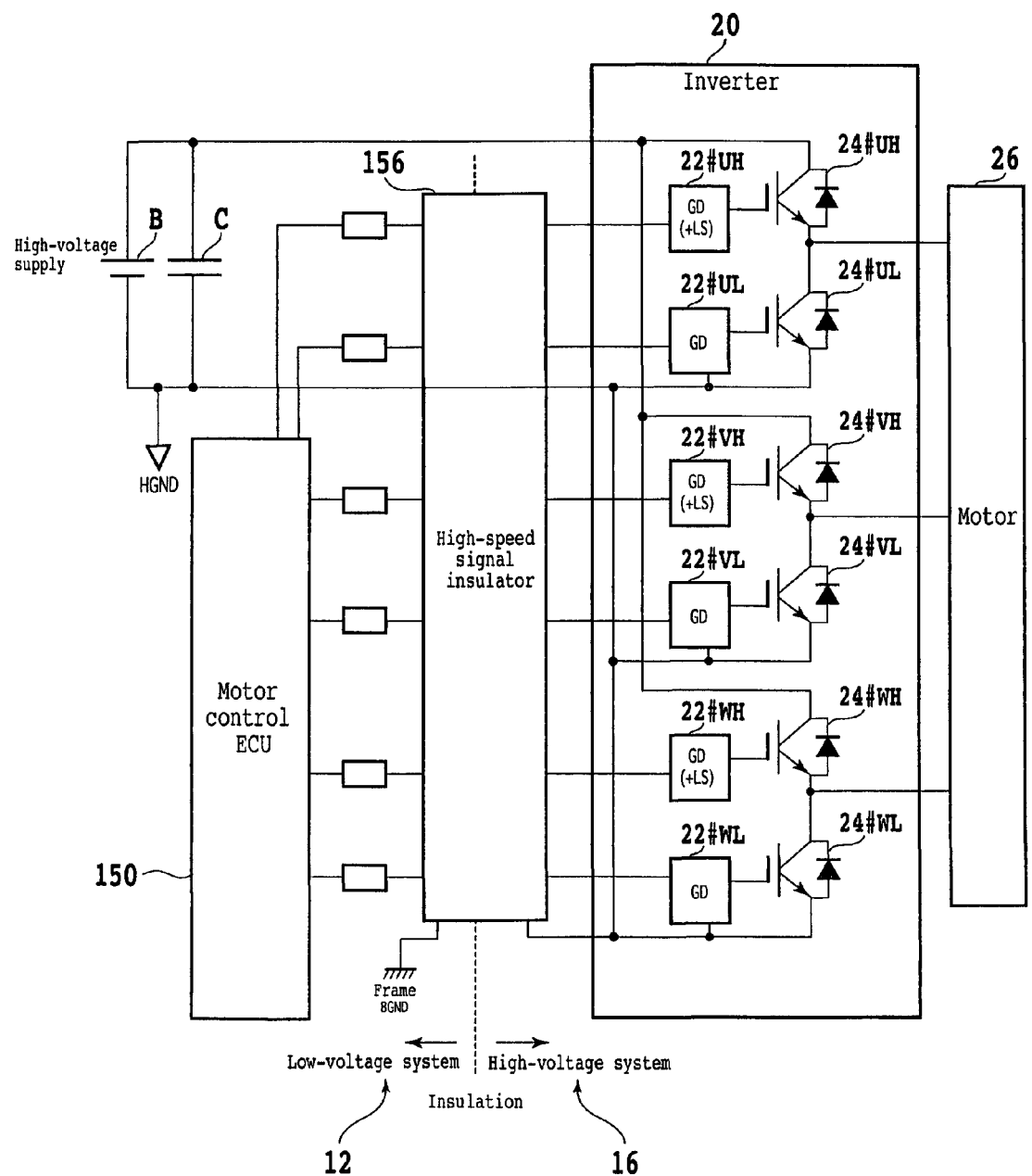
FIG. 12 is a schematic configuration diagram of an electric vehicle according to a third embodiment of the present invention.
Figure 13:
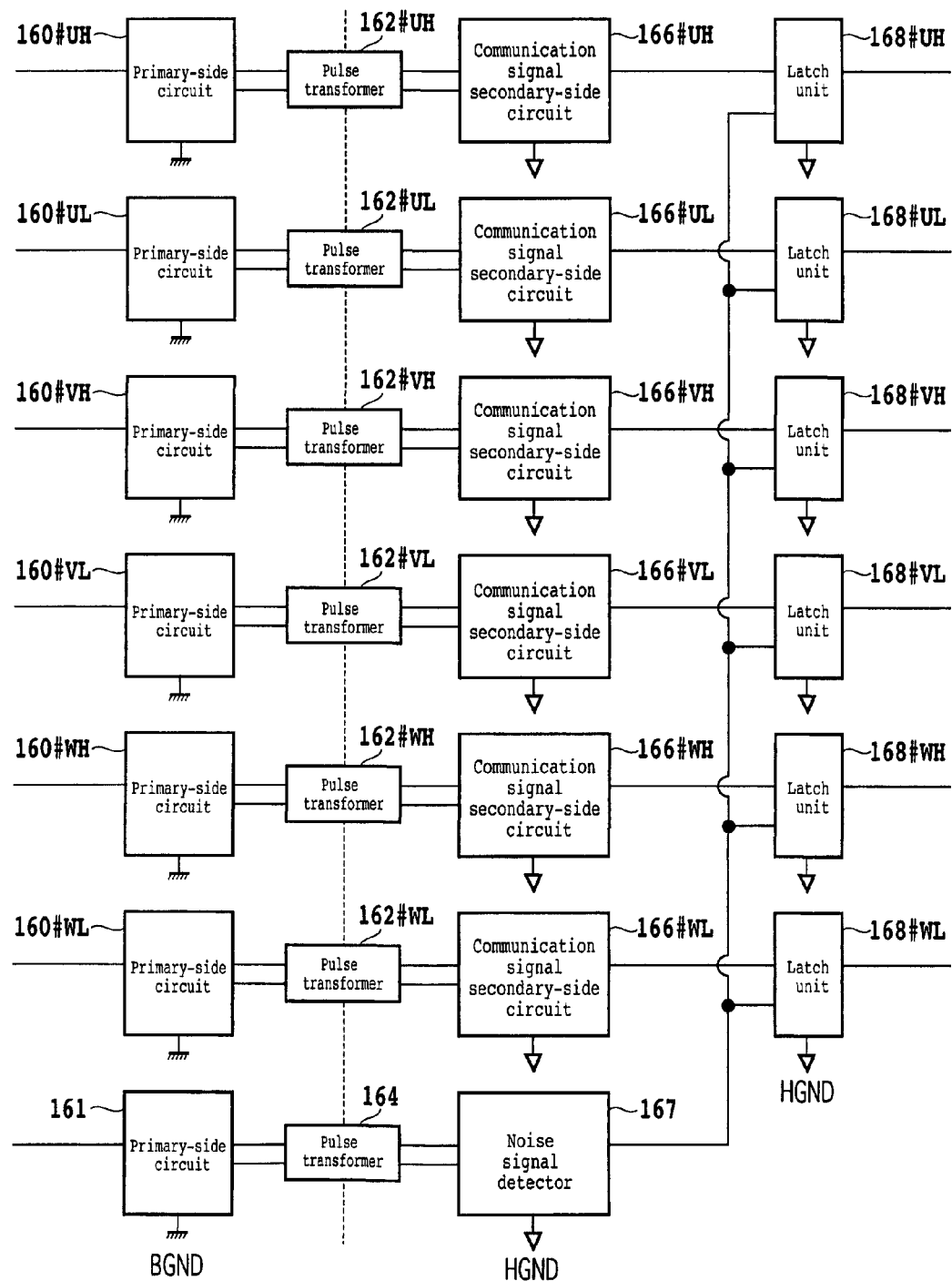
FIG. 13 is a functional block diagram of a high-speed signal insulator according to the third embodiment of the present invention.

FIG. 12 is a configuration diagram of a hybrid vehicle as an electric vehicle showing a third embodiment of the present invention corresponding to FIG. 1B. FIG. 13 is a configuration diagram of a high-speed signal insulator 156 in FIG. 12. As shown in FIG. 13, the high-speed signal insulator 156 has primary-side circuits 160#i (i=UH, UL, VH, VL, WH, WL), a primary-side circuit 161, pulse transformers 162#i (i=UH, UL, VH, VL, WH, WL), a pulse transformer 164, communication signal secondary-side circuits 166#*i* (i=UH, UL, VH, VL, WH, WL), a noise signal detector 167, and latch units 168#*i* (i=UH, UL, VH, VL, WH, WL).

The primary-side circuits 160#*i* (i=UH, UL, VH, VL, WH, WL) are substantially the same as the circuit such as the driver for the communication signal in FIG. 5 and do not include the primary-side circuit relating to noise detection. The primary-side circuit 161 is substantially the same as the primary-side circuit relating to noise detection in FIG. 5.

The primary winding side of the pulse transformers 162#*i* (i=UH, UL, VH, VL, WH, WL) and the primary winding side of the pulse transformer 164 are mounted on a conductor pattern, and the low-voltage system ground BGND of the primary-side circuits 160#*i* (i=UH, UL, VH, VL, WH, WL) and the primary-side circuit 161 is connected to the conductor pattern.

The secondary winding side of the pulse transformers 162#*i* (i=UH, UL, VH, VL, WH, WL) and the secondary winding side of the pulse transformer 164 are mounted on a conductor pattern, and the high-voltage system ground HGND of the communication signal secondary-side circuits 166#*i* (i=UH, UL, VH, VL, WH, WL) and the noise signal detector 167 is connected to the conductor pattern.

The communication signal secondary-side circuits 166#*i* (i=UH, UL, VH, VL, WH, WL) are substantially the same as the full-wave rectifier 108#1, the protection circuit 110#1, the delay time adjuster 112#1, and the detector 114#1 in FIG. 5. The noise signal detector 167 is substantially the same as the full-wave rectifier 108#2, the protection circuit 110#2, the delay time adjuster 112#2, and the detector 114#1 in FIG. 5.

In this way, the primary-side circuit 161, the pulse transformer 164, and the noise signal detector 167, which relate to the noise detection signal, are provided in common to the U-, V-, and W-phases. In addition, noise added to the gate signals of the U-, V-, and W-phases due to a common mode current is in the same phase as that of the noise detection signal. The latch units 168#*i* (i=UH, UL, VH, VL, WH, WL) are substantially the same as the latch unit 116 in FIG. 5.

In the above-described third embodiment, the same advantages as those of the second embodiment can be achieved. In addition, because the circuitry relating to noise detection is provided in common, the circuit configuration is further simplified and thus the cost can be reduced.

Fourth Embodiment

Figure 14:
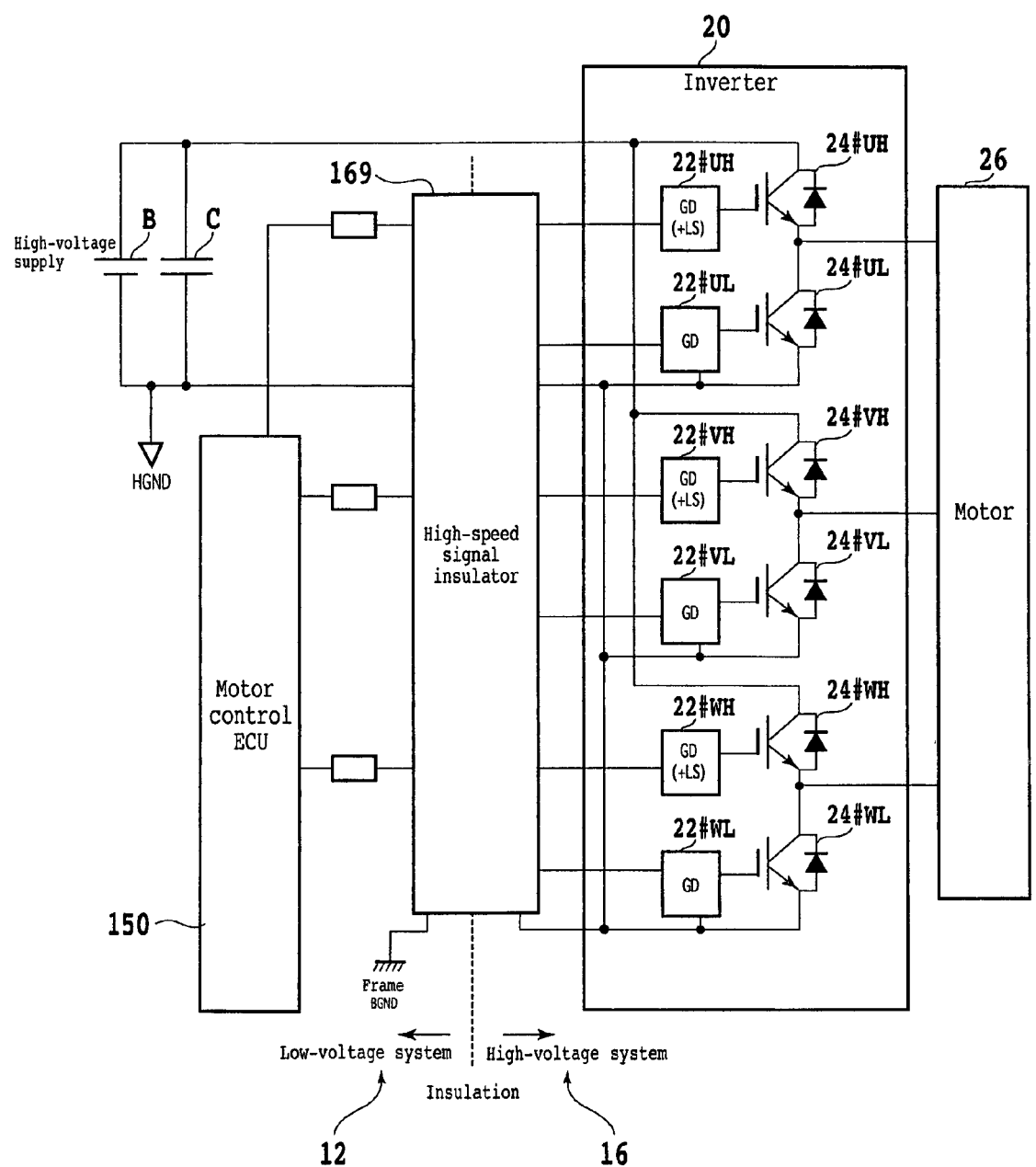
FIG. 14 is a schematic configuration diagram of an electric vehicle according to a fourth embodiment of the present invention.
Figure 15:
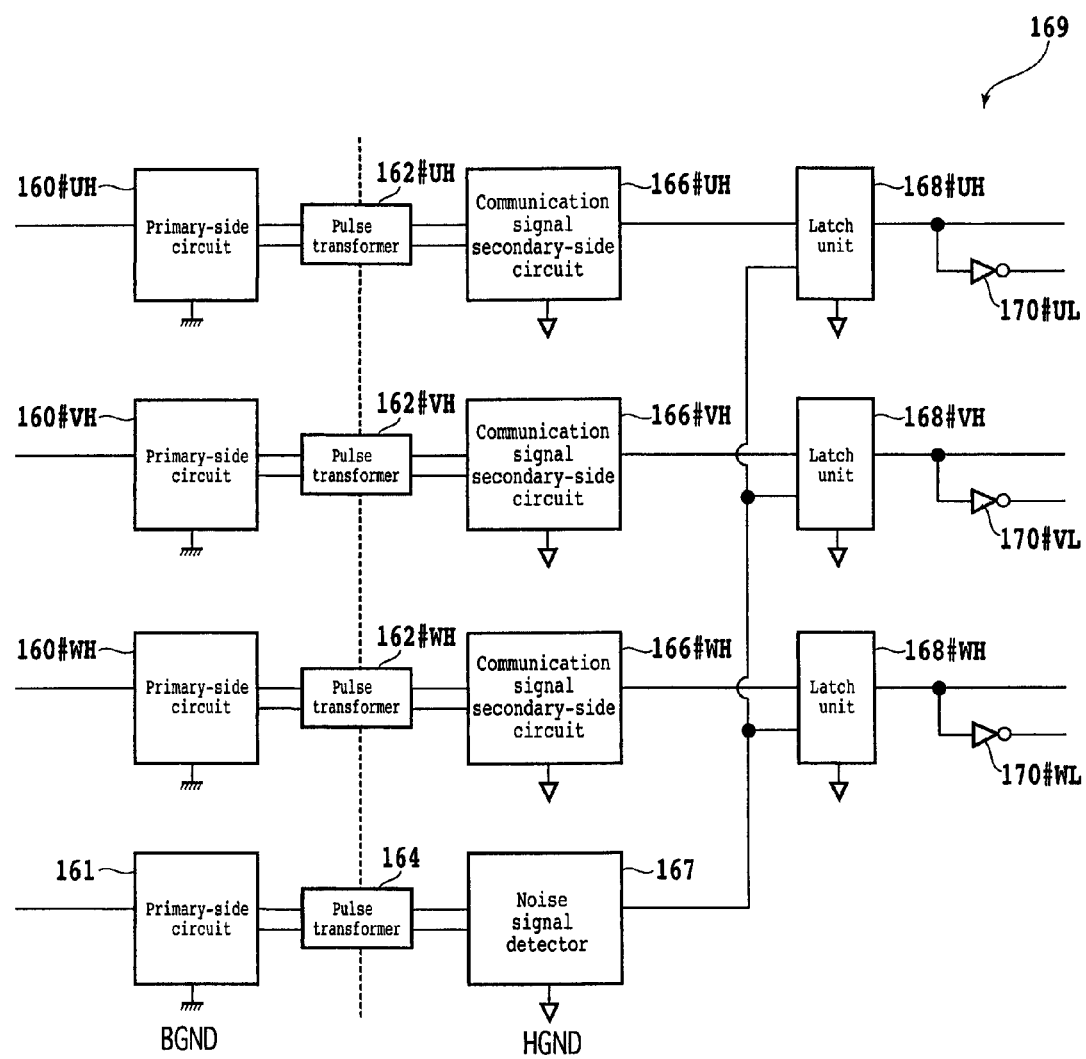
FIG. 15 is a functional block diagram of a high-speed signal insulator according to the fourth embodiment of the present invention.

FIG. 14 is a configuration diagram of a hybrid vehicle as an electric vehicle showing a fourth embodiment of the present invention corresponding to FIG. 1B. FIG. 15 is a configuration diagram of a high-speed signal insulator 169 in FIG. 14. In FIG. 15, the components that are substantially the same as those in FIG. 13 are given the same numerals and symbols. The high-speed signal insulator 169 has the primary-side circuits 160#*i* (i=UH, VH, WH), the primary-side circuit 161, the pulse transformers 162#*i* (i=UH, VH, WH), the pulse transformer 164, the communication signal secondary-side circuits 166#*i* (i=UH, VH, WH), the noise signal detector 167, the latch units 168#*i* (i=UH, VH, WH), and inverters 170#UL, 170#VL, and 170#WL.

The primary-side circuits 160#*i* (i=UH, VH, WH) are substantially the same as the circuit such as the driver for the communication signal in FIG. 5 and do not include the primary-side circuit relating to noise detection. The pulse transformers 162#*i* (i=UH, VH, WH) are substantially the same as the pulse transformer 62#11 in FIG. 5.

The primary winding side of the pulse transformers 162#*i* (i=UH, VH, WH) and the primary winding side of the pulse transformer 164 are mounted on a conductor pattern, and the low-voltage system ground BGND of the primary-side circuits 160#*i* (i=UH, VH, WH) and the primary-side circuit 161 is connected to the conductor pattern. The primary-side circuit 161 is the primary-side circuit relating to noise detection and is substantially the same as that in FIG. 13.

The secondary winding side of the pulse transformers 162#*i* (i=UH, VH, WH) and the secondary winding side of the pulse transformer 164 are mounted on a conductor pattern, and the high-voltage system ground HGND of the communication signal secondary-side circuits 166#*i* (i=UH, VH, WH) and the noise signal detector 167 is connected to the conductor pattern.

The communication signal secondary-side circuits 166#*i* (i=UH, VH, WH) are substantially the same as the full-wave rectifier 108#1, the protection circuit 110#1, the delay time adjuster 112#1, and the detector 114#1 in FIG. 5. The noise signal detector 167 is substantially the same as that in FIG. 13. In this way, the primary-side circuit 161, the pulse transformer 164, and the noise signal detector 167, which relate to the noise detection signal, are provided in common to the U-, V-, and W-phases.

The latch units 168#*i* (i=UH, VH, WH) are substantially the same as the latch unit 116 in FIG. 5. The inverter 170#*i* (i=UL, VL, WL) inverts the output of the latch unit 168#*i* (i=UH, VH, WH) and outputs a gate signal for the SW element 24#*i* (i=UL, VL, WL).

In the above-described fourth embodiment, the same advantages as those of the third embodiment can be achieved. In addition, for the SW elements 24#*i* (i=UL, VL, WL), the gate signals are produced by inverting the gate signals for the SW elements 24#*i* (i=UH, VH, WH) without providing high-speed signal insulators. Therefore, the circuit configuration is further simplified and thus the cost can be reduced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An insulating communication circuit that transmits a communication signal based on insulation from first ground circuitry having a first ground to second ground circuitry having a second ground different from the first ground, the insulating communication circuit comprising:
   a first insulating circuit that has first and second circuits;
   a second insulating circuit that has third and fourth circuits;
   a communication interface that is connected to the first ground and transmits a signal to the first circuit based on the communication signal and a clock signal from an external control device;
   a secondary-side signal detection circuit that is connected to the second ground and detects the communication signal from an output of the second circuit based on an output of the first circuit;
   a primary-side noise detection circuit that is connected to the first ground and detects a common mode current between the third and fourth circuits;
   a secondary-side noise detection circuit that is connected to the second ground and detects common mode noise from an output of the fourth circuit based on the common mode current to output a noise detection signal;
   a delay time adjustment circuit that adjusts transmission speed of the communication signal detected by the secondary-side signal detection circuit and transmission speed of the noise detection signal detected by the secondary-side noise detection circuit; and a signal latch circuit that latches the communication signal adjusted by the delay time adjustment circuit when the noise detection signal adjusted by the delay time adjustment circuit detects the common mode noise.

2. The insulating communication circuit according to claim 1, wherein a first pulse transformer including a first primary winding and a first secondary winding and a second pulse transformer including a second primary winding and a second secondary winding are used as insulating means of the first and second insulating circuits.

3. The insulating communication circuit according to claim 2, wherein the first and second pulse transformers are housed in an integrated circuit package, the first and second primary windings are mounted on a first conductor and the first and second secondary windings are mounted on a second conductor, a first ground for a signal transmitted to the first primary winding is supplied from the first conductor and a first ground of the primary-side noise detection circuit is connected to the first conductor, and the second ground of the secondary-side signal detection circuit and the secondary-side noise detection circuit is connected to the second conductor.

4. The insulating communication circuit according to claim 3, wherein the first ground is a low-voltage system ground connected to a vehicle body, and the second ground is a high-voltage system ground connected to a negative electrode of a high-voltage direct current power supply.

5. The insulating communication circuit according to claim 4, wherein the delay time adjustment circuit carries out adjustment in such a way that transmission speed of the noise detection signal is set higher than transmission speed of the communication signal at start of the common mode noise and the transmission speed of the noise detection signal is set lower than the transmission speed of the communication signal at end of the common mode noise.

6. The insulating communication circuit according to claim 5, wherein the delay time adjustment circuit includes a plurality of resistor-capacitor circuits for the communication signal and the noise detection signal, and a time constant of a resistor-capacitor circuit relating to the communication signal is larger than a time constant of a resistor circuit relating to the noise detection signal at the start of the common mode noise, and a time constant of a resistor-capacitor circuit relating to the communication signal is smaller than a time constant of a resistor-capacitor circuit relating to the noise detection signal at the end of the common mode noise.

* * * * *